United States Patent
Ohmura et al.

(10) Patent No.: US 6,724,668 B2
(45) Date of Patent: Apr. 20, 2004

(54) SEMICONDUCTOR DEVICE PROVIDED WITH MEMORY CHIPS

(75) Inventors: Ryuji Ohmura, Hyogo (JP); Kazushi Sugiura, Hyogo (JP); Shinichi Kobayashi, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/140,104

(22) Filed: May 8, 2002

(65) Prior Publication Data

US 2003/0107926 A1 Jun. 12, 2003

(30) Foreign Application Priority Data

Oct. 12, 2001 (JP) .................................. 2001-314904

(51) Int. Cl.[7] .............................................. G11C 7/00
(52) U.S. Cl. .................. 365/200; 365/201; 365/189.04
(58) Field of Search ................................ 365/200, 201, 365/189.07, 189.04, 230.03

(56) References Cited

U.S. PATENT DOCUMENTS

| 6,141,267 | A | * | 10/2000 | Kirihata et al. ............ 365/200 |
| 6,243,306 | B1 | * | 6/2001 | Kirihata ..................... 365/200 |
| 6,320,800 | B1 | * | 11/2001 | Saito et al. ................. 365/200 |
| 6,532,181 | B2 | * | 3/2003 | Saito et al. ................. 365/200 |
| 6,538,924 | B2 | * | 3/2003 | Dono et al. ............ 365/185.08 |
| 2003/0030135 | A1 | * | 2/2003 | Ohmura et al. ............. 257/681 |

FOREIGN PATENT DOCUMENTS

| JP | 11-176194 | 7/1999 |
| JP | 2000-149588 | 5/2000 |
| JP | 2000-260198 | 9/2000 |
| JP | 2000-285695 | 10/2000 |

* cited by examiner

Primary Examiner—Gene Auduong
(74) Attorney, Agent, or Firm—McDermott, Will & Emery

(57) ABSTRACT

In each of a plurality of memory chips in the semiconductor integrated circuit device, an address signal of a defective memory cell in a memory circuit is obtained by a pattern generation tester circuit and a repair analysis circuit, and stored in a replacement storage circuit. The address signal read out of the replacement storage circuit is set to a replacement-repair circuit, and the defective memory cell is replaced with a spare memory cell. The replacement of a defective memory cell with a spare memory cell is allowed even after packaging, so that the yield is increased. The test time is also reduced, as the plurality of memory chips are tested in parallel.

11 Claims, 19 Drawing Sheets

SEMICONDUCTOR DEVICE PROVIDED WITH MEMORY CHIPS

BACKGROUND OF THE INVENTION

1. Field of the Invention

The present invention relates to semiconductor devices, and more particularly to a semiconductor device provided with a plurality of memory chips.

2. Description of the Background Art

Conventionally, a semiconductor integrated circuit device having a plurality of memory chips of different kinds provided in one package is known. In such a conventional semiconductor integrated circuit device, a wafer test is conducted for each memory chip with an individual test standard, and a defective memory cell found is repaired by replacing it with a spare memory cell. Thereafter, the test is conducted again, and a memory chip whose memory cells are all normal is selected, which is then subjected to dicing and packaging. Here, to repair the defective memory cell, a laser trimming device is used to blow a fuse to program an address signal for the defective memory cell. When the relevant address signal is input, a spare memory cell is selected for replacement of the defective memory cell.

A memory cell may also become defective after packaging, due to various reasons. Thus, the test is conducted again after packaging, and only the semiconductor integrated circuit devices having the plurality of memory chips of different kinds with all the memory cells being normal are shipped as products.

With the conventional semiconductor integrated circuit devices, however, those found defective after packaging could not be repaired. Assuming that one semiconductor integrated circuit device has three memory chips incorporated therein, each with the yield after packaging of a%, b% and c%, respectively, then the overall yield thereof will be degraded to a%×b%×c%.

In addition, the test after packaging is likely to take a long time, since the plurality of memory chips incorporated in each semiconductor integrated circuit device should be tested one by one in series.

SUMMARY OF THE INVENTION

Based on the foregoing, a main object of the present invention is to provide a semiconductor device that assures a high yield, requiring a less test time.

The semiconductor device according to the present invention includes a plurality of memory chips, a tester circuit, a nonvolatile memory, and a transfer control circuit. Each memory chip includes: a plurality of memory cells; a spare memory cell; a holding circuit for holding an address signal of defective one of the memory cells; a memory cell select circuit selecting the spare memory cell when the address signal received matches the address signal held in the holding circuit, and selecting the memory cell corresponding to the received address signal when the received address signal differs from the address signal held in the holding circuit; and a write/read circuit performing writing/reading of a data signal with respect to the selected memory cell. The tester circuit tests the plurality of memory chips in parallel with each other, and obtains the address signal of the defective one of the plurality of memory cells in the respective memory chips. The nonvolatile memory stores the address signal obtained by the tester circuit. The transfer control circuit reads the address signal out of the nonvolatile memory, and transfers the address signal to the holding circuit of the memory chip corresponding to the relevant address signal. Accordingly, the address signal of the defective memory cell in each memory chip is obtained by the tester circuit, and the obtained address signal is stored in the nonvolatile memory. The address signal read out of the nonvolatile memory is transferred to the holding circuit in the corresponding memory chip, and the defective memory cell is replaced with the spare memory cell. Thus, even if a memory cell becomes defective after packaging, the defective memory cell can be replaced with the spare memory cell. This improves the yield of the semiconductor device. In addition, the tester circuit tests the plurality of memory chips in parallel. Therefore, compared to the case of testing the memory chips in series, the test time can be reduced.

Preferably, the tester circuit includes a plurality of sub-tester circuits provided corresponding to the plurality of memory chips. Each sub-tester circuit is provided to the corresponding memory chip for testing thereof, and obtains the address signal of the defective one of the plurality of memory cells in the corresponding memory chip. The nonvolatile memory includes a plurality of sub-nonvolatile memories provided corresponding to the plurality of memory chips. Each sub-nonvolatile memory is provided to the corresponding memory chip, and stores the address signal obtained by the corresponding sub-tester circuit. The address signal read out of each sub-nonvolatile memory is transferred to the corresponding holding circuit. In this case, the sub-tester circuit and sub-nonvolatile memory are provided for each memory chip, so that testing and repairing of the plurality of memory chips can readily be performed in parallel.

Still preferably, the tester circuit includes a plurality of sub-tester circuits provided corresponding to the plurality of memory chips. Each sub-tester circuit is provided to the corresponding memory chip for testing thereof, and obtains the address signal of the defective one of the plurality of memory cells in the corresponding memory chip. The nonvolatile memory is provided in predetermined one of the plurality of memory chips, and stores the address signal obtained by each sub-tester circuit. The holding circuits of the plurality of memory chips are connected in series. The address signal read out of the nonvolatile memory is transferred via one of the holding circuits to another one of the holding circuits. In this case, the nonvolatile memory is provided in one of the plurality of memory chips, so that the chip area of the other memory chip(s) can be reduced.

Still preferably, the tester circuit and the nonvolatile memory are provided in predetermined one of the plurality of memory chips. The holding circuits of the plurality of memory chips are connected in series. The address signal read out of the nonvolatile memory is transferred via one of the holding circuits to another one of the holding circuits. In this case, the tester circuit and the nonvolatile memory are provided in one memory chip. Thus, the chip area of the other memory chip(s) can further be reduced.

Still preferably, the semiconductor device further includes a test chip that is provided separately from the plurality of memory chips. The tester circuit is provided in the test chip. The nonvolatile memory is provided in predetermined one of the plurality of memory chips. The holding circuits of the plurality of memory chips are connected in series. The address signal read out of the nonvolatile memory is transferred via one of the holding circuits to another one of the holding circuits. In this case, the tester circuit is provided in the test chip independent from the memory chips. Thus, defectiveness of the tester circuit is prevented from causing defectiveness of the memory chip(s).

Still preferably, the predetermined memory chip is a flash memory, and the nonvolatile memory is a flash memory. In this case, the memory cells of the predetermined memory chip and of the nonvolatile memory can be manufactured in the same process. This leads to simplification of the manufacturing process.

Still preferably, the semiconductor device further includes a test chip provided separately from the plurality of memory chips, and the tester circuit and the nonvolatile memory are provided in the test chip. The holding circuits of the plurality of memory chips are connected in parallel with respect to the nonvolatile memory. The address signal read out of the nonvolatile memory is transferred directly to the corresponding holding circuit. In this case, the tester circuit and the nonvolatile memory are provided in the test chip independent from the memory chips. Thus, the tester circuit and the nonvolatile memory can be manufactured with optimal process rules. This prevents degradation in yield of the semiconductor device due to defectiveness of the tester circuit or the nonvolatile memory.

Still preferably, each memory chip is further provided with a program circuit that includes at least one fuse and programs the address signal of the defective memory cell based on whether the fuse is blown or not. The memory cell select circuit selects the corresponding spare memory cell for replacement of the memory cell corresponding to the received address signal when the received address signal matches either the address signal programmed in the corresponding program circuit or the address signal held in the corresponding holding circuit. It selects the memory cell corresponding to the received address signal when the received address signal is different from both the address signal programmed in the corresponding program circuit and the address signal held in the corresponding holding circuit. In this case, the defective memory cell can also be replaced with the spare memory cell by conducting the test in the wafer state and programming the address signal of the defective memory cell.

Still preferably, the semiconductor device further includes a read circuit for reading the address signal programmed in the program circuit for externally output. In this case, it is readily possible, after packaging, to determine whether the spare memory cell has been used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
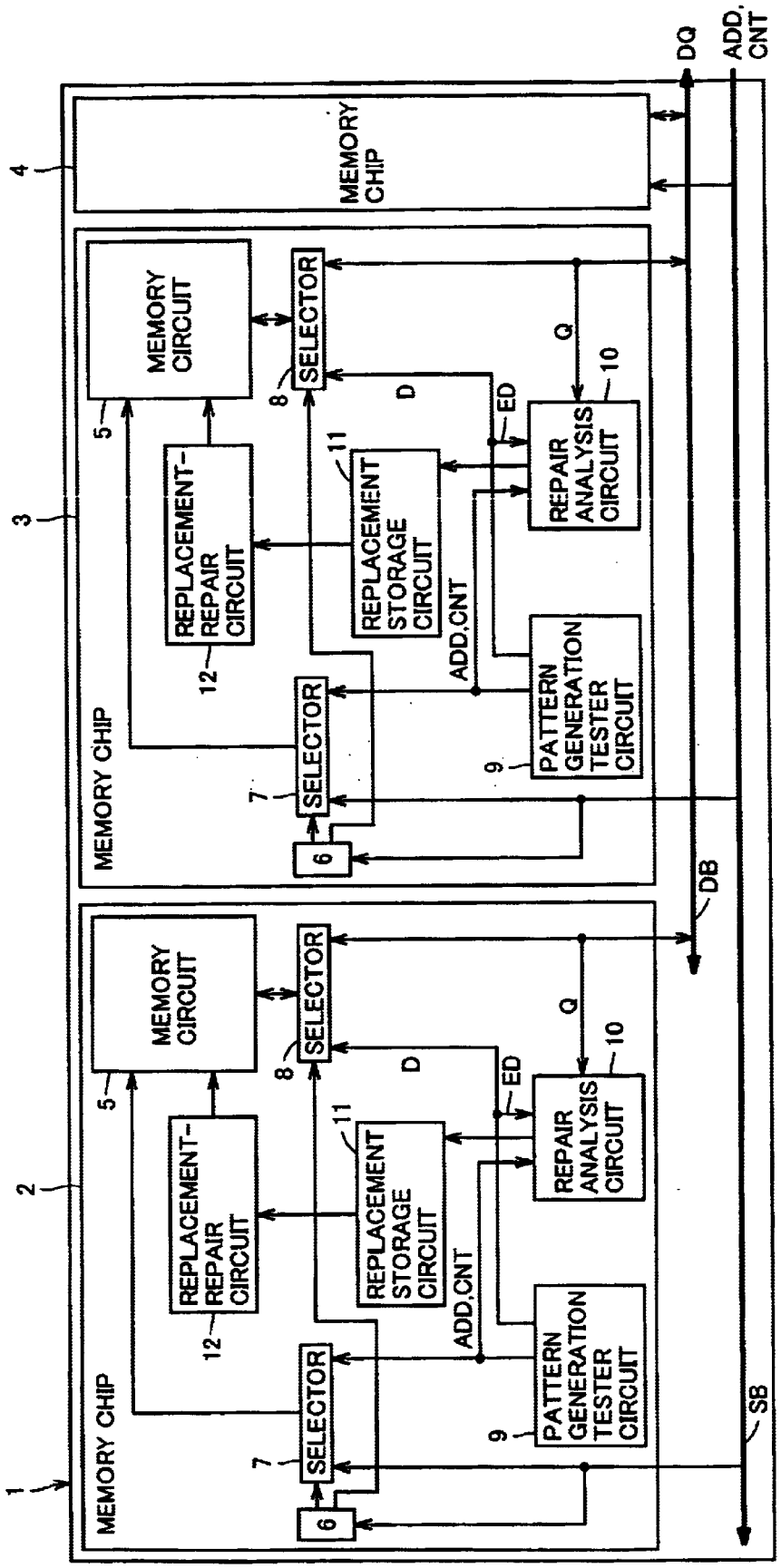
FIG. 1 is a block diagram showing a configuration of the semiconductor integrated circuit device according to a first embodiment of the present invention.

Referring to FIG. 1, the semiconductor integrated circuit device 1 according to the first embodiment includes a plurality of memory chips 2–4 of multiple kinds (3 kinds in FIG. 1), a data bus DB and a signal bus SB. Each of memory chips 2–4 includes a memory circuit 5.

Figure 2:
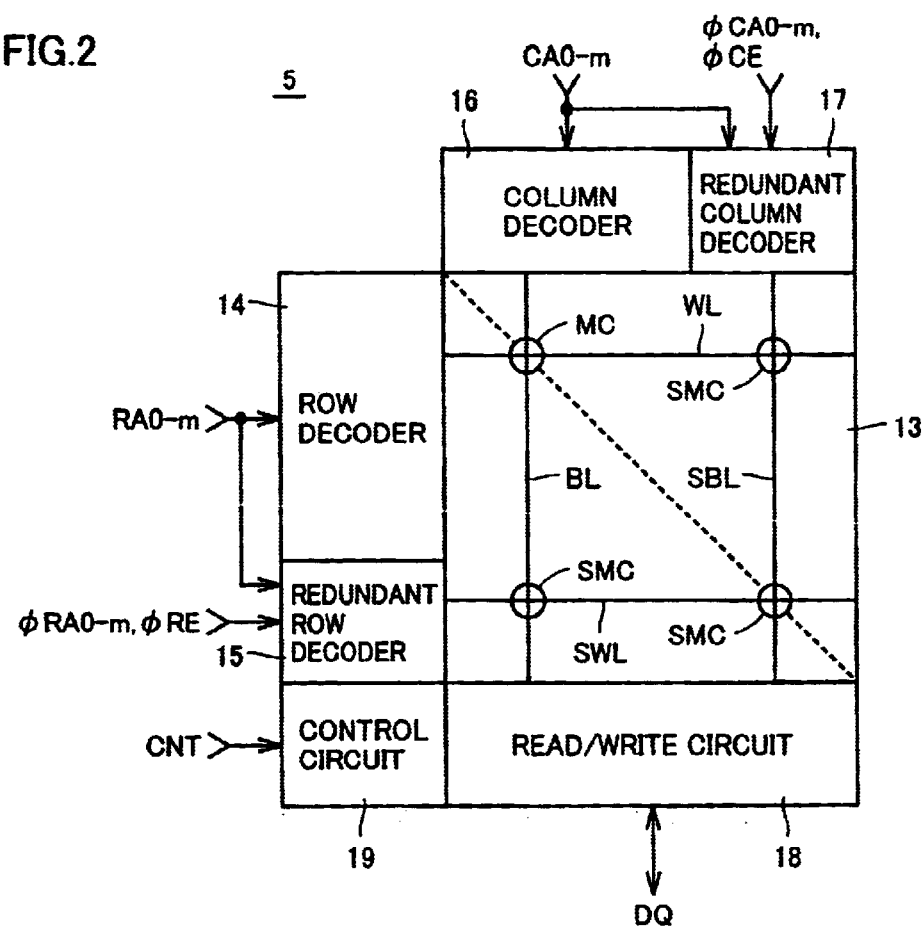
FIG. 2 is a block diagram showing a configuration of the memory circuit shown in FIG. 1.

As shown in FIG. 2, memory circuit 5 includes a memory array 13, a row decoder 14, a redundant row decoder 15, a column decoder 16, a redundant column decoder 17, a read/write circuit 18, and a control circuit 19. Memory array 13 includes a plurality of memory cells MC arranged in rows and columns, a plurality of word lines WL provided corresponding to the rows, and a plurality of bit lines BL provided corresponding to the columns. Memory array 13 further includes a prescribed number of spare word lines SWL disposed to cross the plurality of bit lines BL, a prescribed number of spare bit lines SBL disposed to cross the plurality of word lines WL, and spare memory cells SMC placed at respective crossings of bit lines BL and spare word lines SWL and at respective crossings of word lines WL and spare bit lines SBL.

Row decoder 14 selects one of the plurality of word lines WL in accordance with row address signals RA0–RAm (m is an integer not smaller than 0). Redundant row decoder 15 is activated in response to a signal φRE having attained an H level corresponding to an activated level. In the case where row address signals RA0–RAm and defective row address signals φRA0–φRAm match with each other, redundant row decoder 15 inactivates row decoder 14 and selects a prescribed spare word line SWL.

Column decoder 16 selects one of the plurality of bit lines BL according to column address signals CA0–CAm. Redundant column decoder 17 is activated when a signal φCE attains an H level of the activated level. In response to the fact that column address signals CA0–CAm and defective column address signals φCA0–φCAm match with each other, redundant column decoder 17 inactivates column decoder 16 and selects a prescribed spare bit line SBL.

Read/write circuit 18 performs read/write of data Q/D with respect to memory cell MC or SMC at a crossing of word line WL or SWL selected by row decoder 14 or 15 and bit line BL or SBL selected by column decoder 16 or 17. Control circuit 19 performs overall control of memory circuit 5 in accordance with a control signal CNT.

Figure 3:
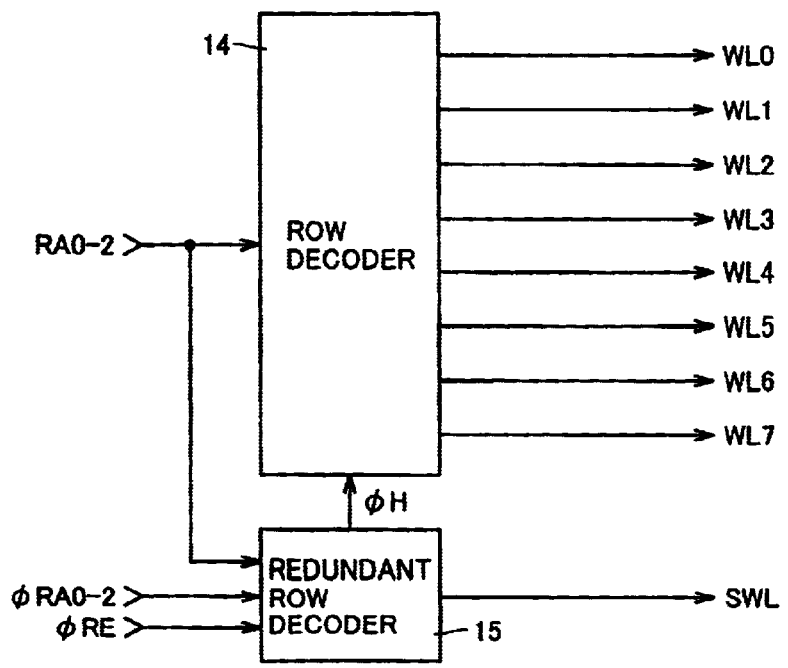
FIG. 3 is a block diagram illustrating operations of the row decoder and the redundant row decoder shown in FIG. 2.

Here, the row select operation will be explained in more detail. In FIG. 3, only eight word lines WL and one spare word line SWL are shown, for simplification of drawing and explanation. Eight word lines WL0–WL7 are preassigned with row address signals RA0–RA2=000, 001, . . . 111, respectively. Row decoder 14 is activated when a hit signal φH from redundant row decoder 15 is at an L level corresponding to an inactivated level, and selects word line WL corresponding to the row address signals RA0–RA2 having been input, so that each memory cell MC connected to the word line WL of the selected level is activated. When hit signal φH is at an H level of the activated level, row decoder 14 is inactivated, and eight word lines WL0–WL7 are all fixed to an non-selected level.

Figure 4:
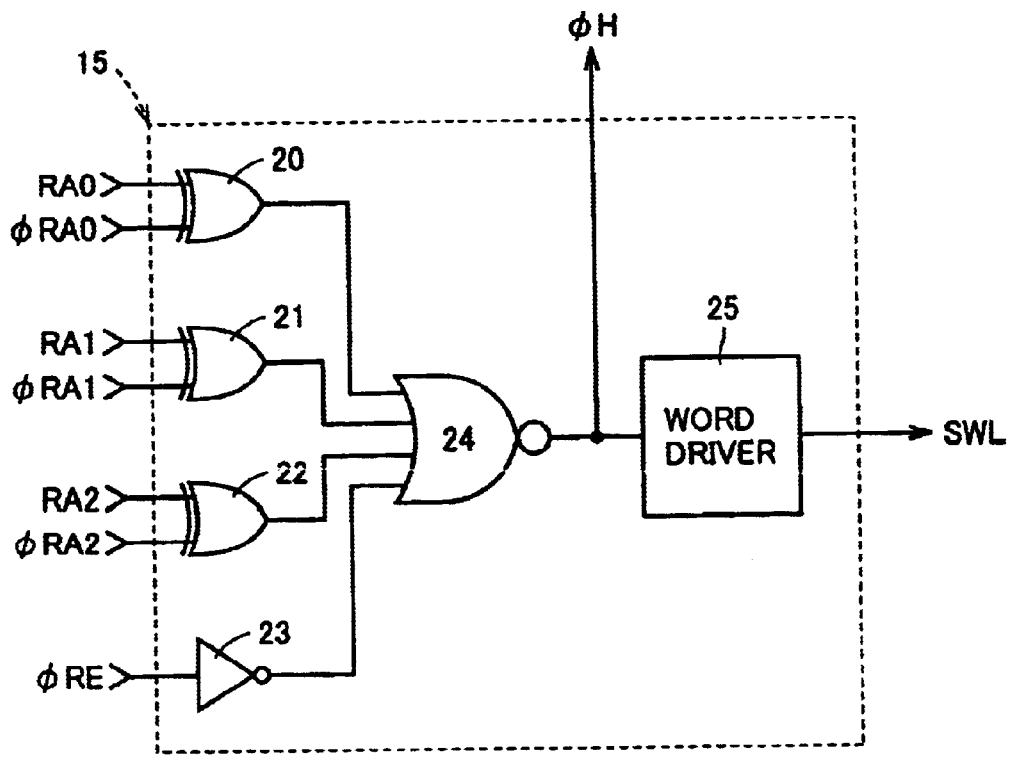
FIG. 4 is a circuit diagram showing a configuration of the redundant row decoder shown in FIG. 3.

As shown in FIG. 4, redundant row decoder 15 includes EX-OR gates 20–22, an inverter 23, a NOR gate 24 and a word driver 25. Row address signals RA0–RA2 are each applied to respective one of the input nodes of EX-OR gates 20–22. Defective row address signals φRA0–φRA2 are applied to the other input nodes of EX-OR gates 20–22, respectively. An activation signal φRE is applied to inverter 23. NOR gate 24 receives output signals of EX-OR gates 20–22 and of inverter 23, and outputs hit signal φH. Word driver 25, in response to hit signal φH having attained an H level of the activated level, drives spare word line SWL to a selected level.

If the logical levels of signals RA0 and φRA0, signals RA1 and φRA1, and signals RA2 and φRA2 all match with each other and signal φRE is at an H level, then the output signals from EX-OR gates 20–22 and inverter 23 all attain an L level. The output signal φH from NOR gate 24 attains an H level, so that spare word line SWL is driven to a selected level.

If the logical levels of at least one pair of signals RA0 and φRA0, RA1 and φRA1, and RA2 and φRA2 do not match, or if signal φRE is at an L level, then at least one of the output signals of EX-OR gates 20–22 and inverter 23 attains an H level. Thus, the output signal φH of NOR gate 24 attains an L level, and spare word line SWL is driven to a non-selected level. Column decoder 16 and redundant column decoder 17 have the same configurations as row decoder 14 and redundant row decoder 15.

Figure 5:
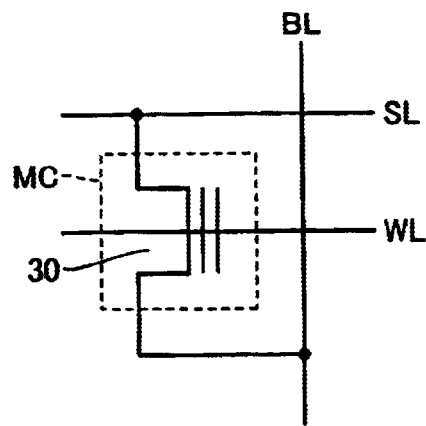
FIG. 5 is a circuit diagram showing a configuration of the memory cell included in the memory circuit 5 of memory chip 2 shown in FIG. 1.

Memory circuit 5 of memory chip 2 is a flash memory. Memory cell MC of the flash memory includes one memory transistor 30, as shown in FIG. 5. It stores data of one bit by controlling the potentials of word line WL, bit line BL, source line SL and others to switch the threshold potential of memory transistor 30 between high and low. The flash memory is a nonvolatile memory that retains stored data even when power is shut down. It however requires a long period of time for data signal writing.

Figure 6:
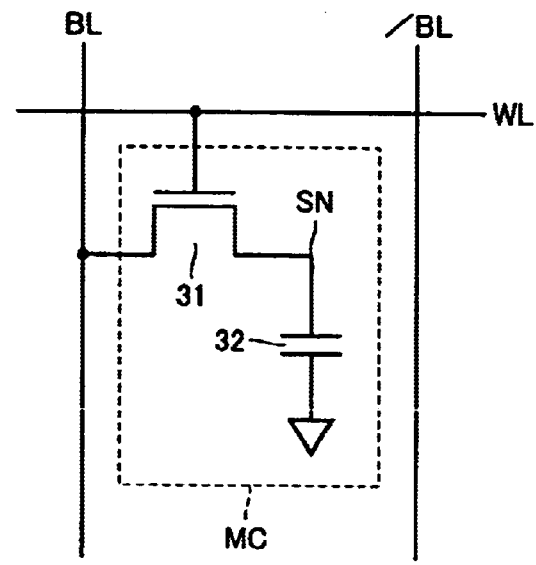
FIG. 6 is a circuit diagram showing a configuration of the memory cell included in the memory circuit 5 of memory chip 3 shown in FIG. 1.

Memory circuit 5 of memory chip 3 is a DRAM. Memory cell MC of the DRAM includes an N channel MOS transistor 31 and a capacitor 32, as shown in FIG. 6. It stores data of one bit by controlling the potentials of word line WL and bit line pair BL,/BL and driving a storage node SN between N channel MOS transistor 31 and capacitor 32 to either an H level or an L level. The DRAM is a volatile memory that does not retain stored data when the power is shut down. Although it requires data rewriting (or refresh) every prescribed period of time, it assures a large memory capacity by virtue of the small size of memory cell MC.

Figure 7:
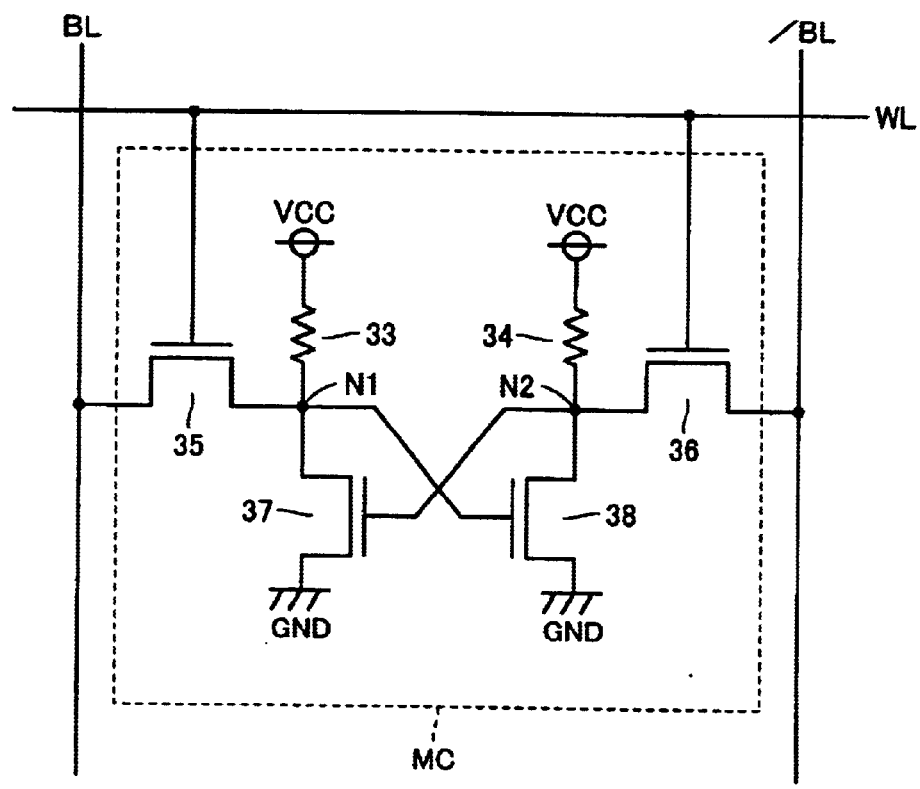
FIG. 7 is a circuit diagram showing a configuration of the memory cell included in the memory circuit 5 of memory chip 4 shown in FIG. 1.

Memory circuit 5 of memory chip 4 is an SRAM. Memory cell MC of the SRAM includes two resistor elements 33, 34 and four N channel MOS transistors 35–38, as shown in FIG. 7. It stores data of one bit by controlling the potentials of word line WL and bit line pair BL,/BL to drive nodes N1 and N2 to an H level and an L level, respectively, or to an L level and an H level, respectively. The SRAM is also a volatile memory that loses stored data when the power is shut down. Although it cannot offer a large memory capacity because of the large size of memory cell MC, it allows high-speed data reading/writing.

Data bus DB is provided for input/output of data signal DQ between respective memory chips 2–4 and the outside. Signal bus SB is provided to externally supply an address signal ADD and a control signal CNT to respective memory chips 2–4.

Returning to FIG. 1, each of memory chips 2–4 further includes a mode control circuit 6, selectors 7, 8, a pattern generation tester circuit 9, a repair analysis circuit 10, a replacement storage circuit 11, and a replacement-repair circuit 12, for testing of normality of memory cells MC in memory circuit 5, and for replacement of a defective memory cell MC with a spare memory cell SMC. Mode control circuit 6 controls respective circuits in corresponding memory chip 2, 3 or 4, in accordance with the external control signal CNT.

Figure 8:
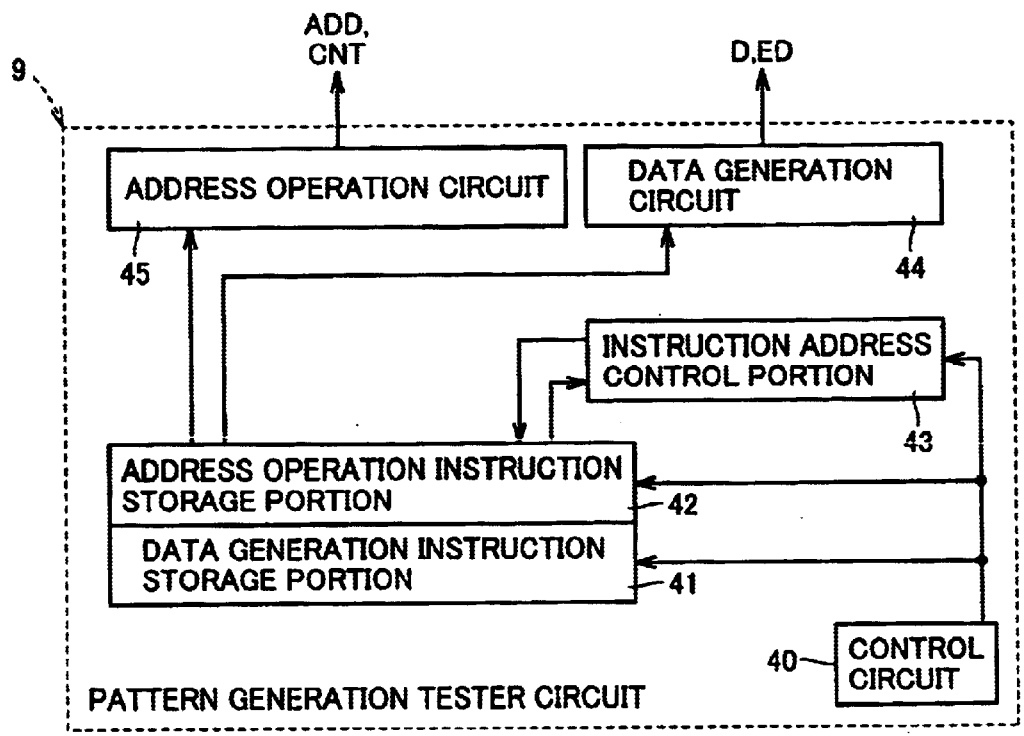
FIG. 8 is a block diagram showing a configuration of the pattern generation tester circuit shown in FIG. 1.

Referring to FIG. 8, pattern generation tester circuit 9 includes: a control circuit 40 which controls the entire pattern generation tester circuit 9; a data generation instruction storage portion 41 which stores an instruction for control of data generation; an address operation instruction storage portion 42 which stores an instruction for control of an address operation; an instruction address control portion 43 which addresses storage portions 41, 42 for reading out an instruction; a data generation circuit 44 which generates a write data signal D and an expected value ED for testing, in accordance with the instruction read out of data generation instruction storage portion 41; and an address operation circuit 45 which generates address signal ADD and control signal CNT for testing, in accordance with the instruction read out of address operation instruction storage portion 42.

Address signal ADD includes row address signals RA0–RAm and column address signals CA0–CAm. Pattern generation tester circuit 9 is activated in a test mode, and generates address signal ADD, control signal CNT and write data signal D to write the data signal D into each memory cell MC of memory circuit 5. It then generates address signal ADD and control signal CNT to read a data signal Q out of each memory cell MC, and at the same time, generates expected value ED of the data signal to be read out of each memory cell MC.

Selector 7 receives the address signal ADD and control signal CNT externally supplied, and the address signal ADD and control signal CNT generated in pattern generation tester circuit 9. In a normal operation, selector 7 provides memory circuit 5 with the externally supplied address signal ADD and control signal CNT. In a test mode, it provides memory circuit 5 with the address signal ADD and control signal CNT generated in pattern generation tester circuit 9. Selector 7 includes switching circuits 7a of the same number as the signals included in address signal ADD and control signal CNT.

Figure 9:
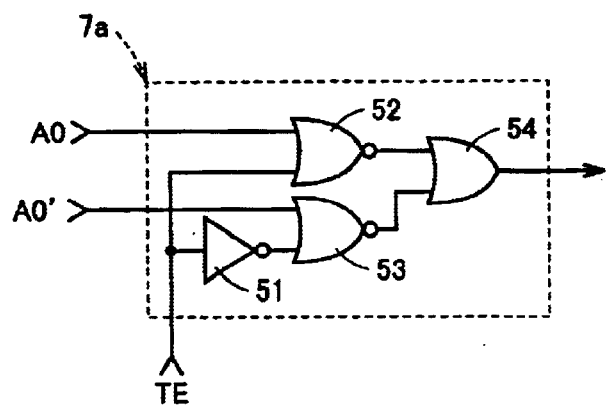
FIG. 9 is a circuit diagram showing a configuration of the switching circuit included in the selector 7 shown in FIG. 1.

Switching circuit 7a includes, as shown in FIG. 9, an inverter 51, NOR gates 52, 53 and an OR gate 54. A test signal TE is directly input to one input node of NOR gate 52, and is also input to one input node of NOR gate 53 via inverter 51. One signal A0 included in the externally supplied address signal ADD or control signal CNT is input to the other input node of NOR gate 52. One signal A0' include in the address signal ADD or control signal CNT generated in pattern generation tester circuit 9 is input to the other input node of NOR gate 53. The output signals of NOR gates 52 and 53 are input to OR gate 54. The output signal of OR gate 54 becomes the output signal of switching circuit 7a.

In the normal operation, test signal TE is driven to an L level of the inactivated level, and the output signal of NOR gate 53 is fixed to an L level. The externally supplied signal A0 is thus provided to memory circuit 5, via NOR gate 52 and OR gate 54. In the test mode, test signal TE is driven to an H level of the activated level, and the output signal of NOR gate 52 is fixed to an L level. Thus, the signal A0' generated in pattern generation tester circuit 9 is provided to memory circuit 5, via NOR gate 53 and OR gate 54.

Returning to FIG. 1, selector 8, in a writing operation of the normal operation, provides memory circuit 5 with a write data signal D that was externally supplied via data bus DB. In a writing operation of the test mode, selector 8 provides memory circuit 5 with the write data signal D that was generated in pattern generation tester circuit 9. In a reading operation of the normal operation, selector 8 transmits read data signal Q from memory circuit 5 to the outside via data bus DB. In a reading operation of the test mode, it provides read data signal Q from memory circuit 5 to repair analysis circuit 10.

Figure 10:
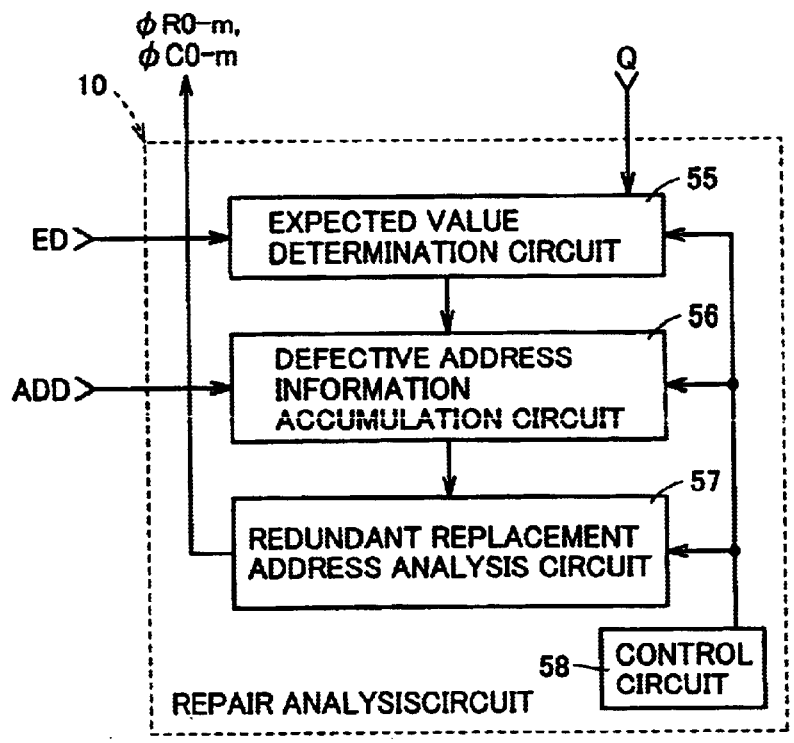
FIG. 10 is a block diagram showing a configuration of the repair analysis circuit shown in FIG. 1.

Repair analysis circuit 10 includes, as shown in FIG. 10, an expected value determination circuit 55, a defective address information accumulation circuit 56, a redundant replacement address analysis circuit 57, and a control circuit 58. Expected value determination circuit 55 compares read data signal Q provided from memory circuit 5 via selector 8 with expected value ED generated in pattern generation tester circuit 9, and outputs a signal of a level corresponding to the comparison result. Expected value ED has the same logical level as data signal D written into the relevant memory cell MC. Thus, when the logical levels of read data signal Q and expected value ED match with each other, expected value determination circuit 55 outputs a signal (of, e.g., an L level) indicating that the relevant memory cell MC is normal. If the logical levels of read data signal Q and expected value ED do not match, expected value determination circuit 55 outputs a signal (of, e.g., an H level) indicating that the memory cell MC is defective.

Defective address information accumulation circuit 56 stores address signal ADD corresponding to the defective memory cell MC in response to the output signal of expected value determination circuit 55. Redundant replacement address analysis circuit 57 uses the data stored in defective address information accumulation circuit 56 to obtain defective row address signals φR0–φRm and/or defective column address signals φC0–φCm to be replaced, for application to replacement storage circuit 11. Control circuit 58 controls the entire repair analysis circuit 10.

Figure 11:
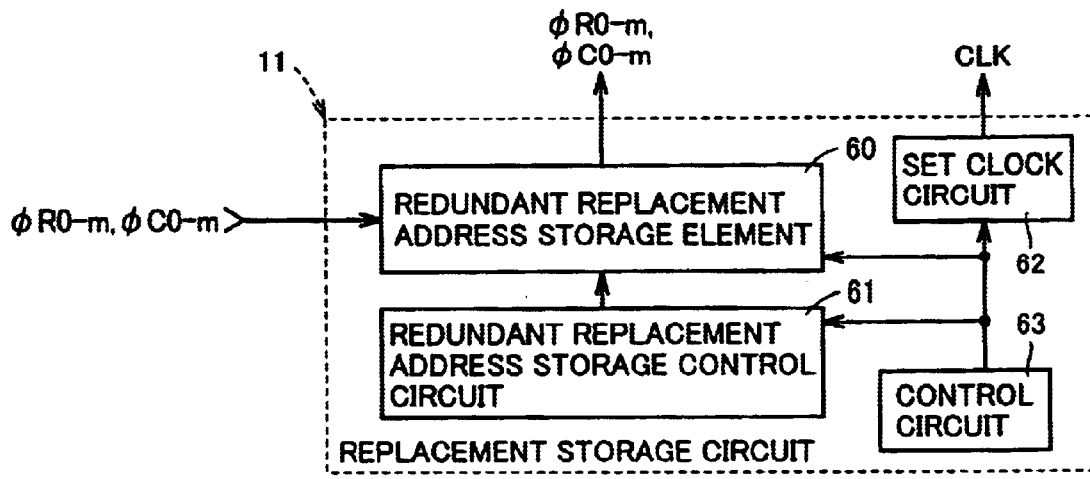
FIG. 11 is a block diagram showing a configuration of the replacement storage circuit shown in FIG. 1.

Replacement storage circuit 11 includes, as shown in FIG. 11, a redundant replacement address storage element 60, a redundant replacement address storage control circuit 61, a set clock circuit 62 and a control circuit 63. Redundant replacement address storage element 60 stores defective row address signals φR0–φRm and defective column address signals φC0–φCm generated in repair analysis circuit 10. Redundant replacement address storage element 60 is formed of, e.g., a nonvolatile semiconductor memory device (like a flash memory), a ferroelectric memory, a memory storing data by blowing out a thin film interconnection by applying an excessive voltage thereto, or a memory storing data by welding an amorphous silicon film.

Redundant replacement address storage control circuit 61 writes defective row address signals φR0–φRm and defective column address signals φC0–φCm generated by repair analysis circuit 10 to redundant replacement address storage element 60. At the time of power on, for example, it reads defective row address signals φR0–φRm and defective column address signals φC0–φCm out of redundant replacement address storage element 60, for application to replacement-repair circuit 12. Set clock circuit 62 outputs a clock signal CLK that is synchronized with defective address signals φR0–φRm, φC0–φCm output from redundant replacement address storage element 60. Control circuit 63 controls the entire replacement storage circuit 11.

Figure 12:
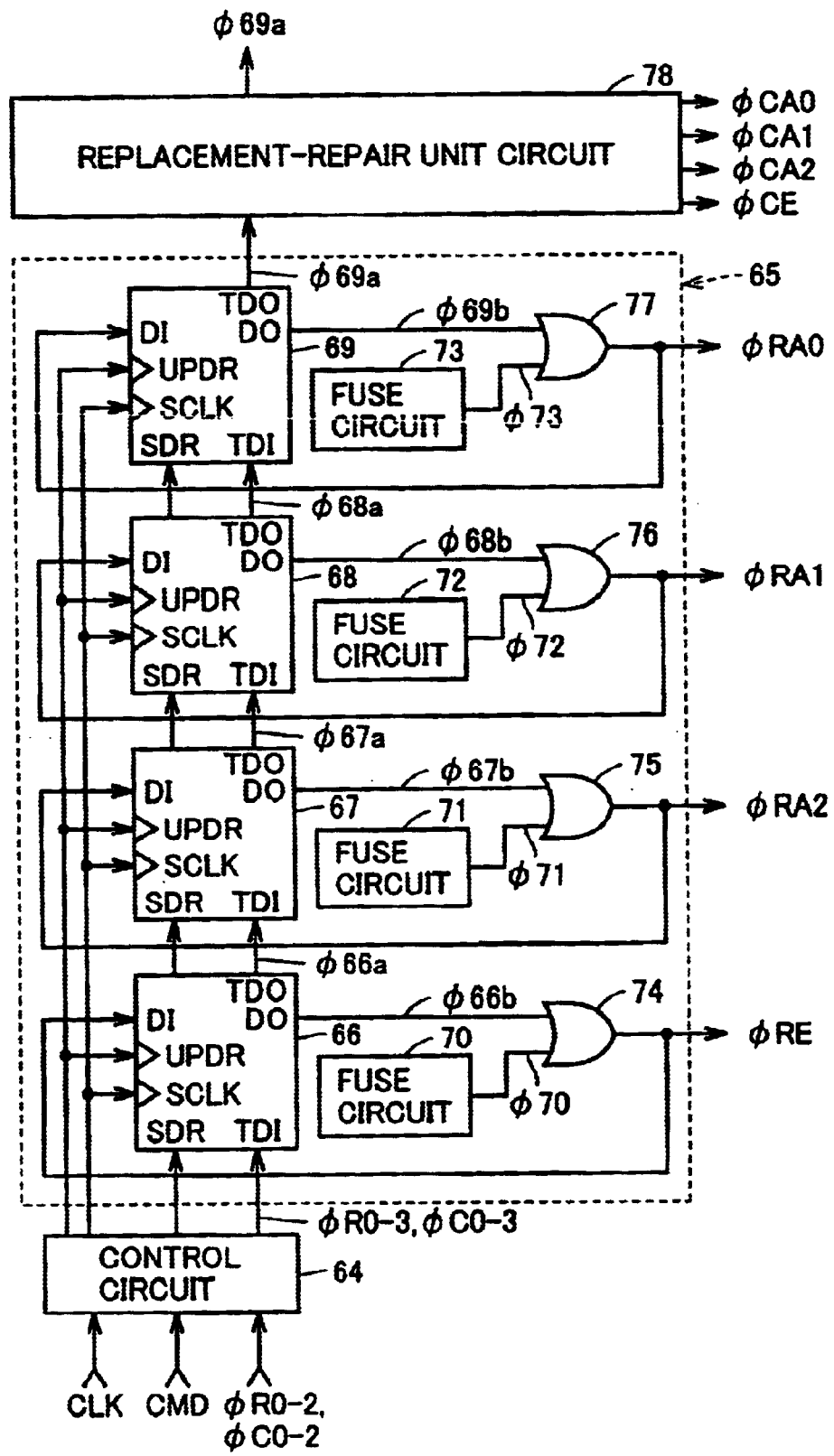
FIG. 12 is a circuit block diagram showing a configuration of the replacement-repair circuit shown in FIG. 1.

Replacement-repair circuit 12 includes, as shown in FIG. 12, a control circuit 64, a replacement-repair unit circuit 65 provided corresponding to respective spare word line SWL, and a replacement-repair unit circuit 78 provided corresponding to respective spare bit line SBL. FIG. 12 shows the replacement-repair circuit 12 in the case where memory circuit 5 includes one spare word line SWL and one spare bit line SBL. Further, m is set to 2 in FIG. 12, as in FIG. 4.

Control circuit 64 receives a command signal CMD from mode control circuit 6 and clock signal CLK from replacement storage circuit 11, and, based on the received signals, generates a shift clock signal SCLK and control signals SDR, UPDR, for application to replacement-repair unit circuits 65, 78. Further, control circuit 64 adds a signal φR3 of an H level to defective row addresses φR0–φR2 from replacement storage circuit 11, to generate signals φR0–φR3, and adds a signal φC3 of an H level to defective column address φC0–φC2 to generate signals φC0–φC3. Control circuit 64 applies the generated signals φC0–φC3, φR–φR3 one by one in sequence to replacement-repair unit circuit 65.

Replacement-repair unit circuit 65 includes register circuits 66–69 provided with shifting function, fuse circuits 70–73, and OR gates 74–77. Register circuit 66 includes a first input terminal TDI and a first output terminal TDO for use in shifting signals, and a second input terminal DI and a second output terminal DO for use in holding and outputting signals. Signals SCLK, UPDR, SDR generated in control circuit 64 are provided to each of register circuits 66–69. Signals φR0–φR3, φC0–φC3 generated in control circuit 64 are sequentially input to first input terminal TDI of register circuit 66. Signals φ66a–φ68a output from first output terminals TDO of respective register circuits 66–68 are provided to first input terminals TDI of respective register circuits 67–69. Signal φ69a output from first output terminal TDO of register circuit 69 is provided to first input terminal TDI of register circuit 66 included in replacement-repair unit circuit 78.

OR gate 74 receives a signal φ66b output from second output terminal DO of register circuit 66 and an output signal φ70 of fuse circuit 70, and outputs signal φRE. OR gate 75 receives a signal φ67b output from second output terminal DO of register circuit 67 and an output signal φ71 of fuse circuit 71, and outputs signal φRA2. OR gate 76 receives a signal φ68b output from second output terminal DO of register circuit 68 and an output signal φ72 of fuse circuit 72, and outputs signal φRA1. OR gate 77 receives a signal φ69b output from second output terminal DO of register circuit 69 and an output signal φ73 of fuse circuit 73, and outputs signal φRA0. Signals φRA0–φRA2 and φRE are provided respectively to EX-OR gates 20–22 and inverter 23 shown in FIG. 4, and also provided to second input terminals DI of register circuits 69–66, respectively.

Figure 13:
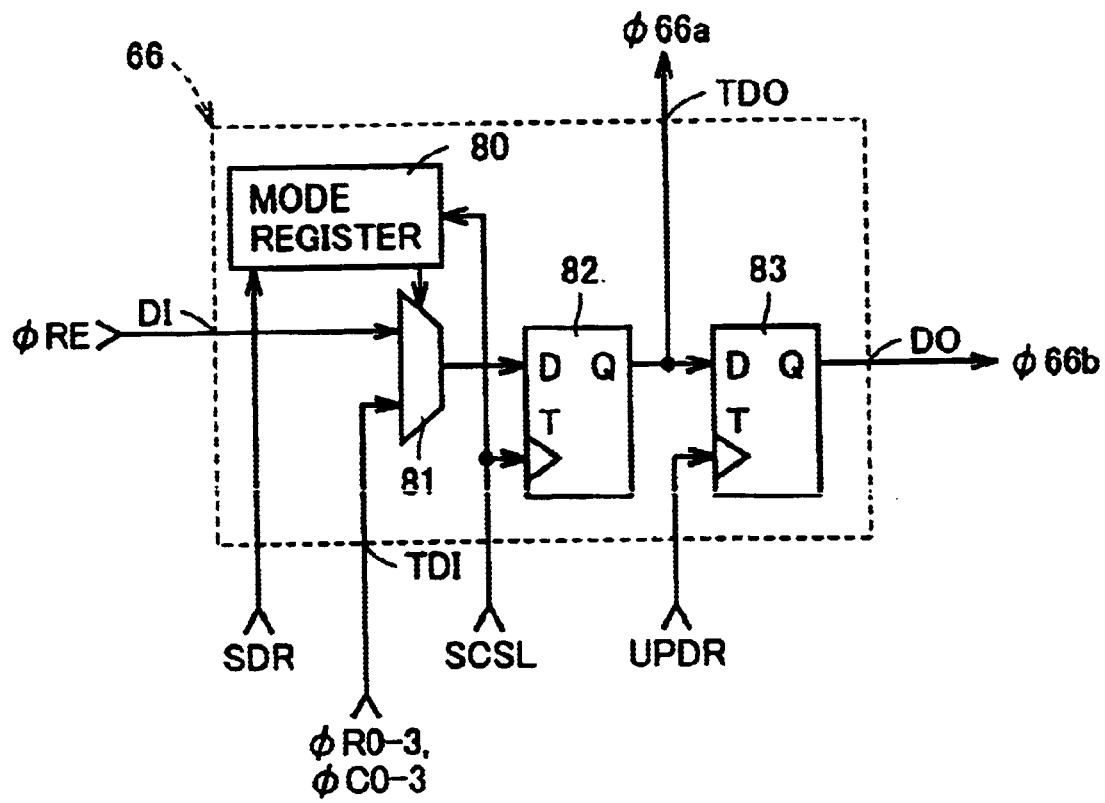
FIG. 13 is a block diagram showing a configuration of the register circuit provided with shifting function shown in FIG. 12.

Register circuit 66 includes a mode register 80, a selector 81, and flip-flops 82 and 83, as shown in FIG. 13. Mode register 80 operates in synchronization with shift clock signal SCLK, and controls selector 81 in accordance with control signal SDR. Selector 81, controlled by mode register 80, connects first input terminal TDI to an input terminal of flip-flop 82 in a register information setting mode wherein a defective address signal is set to register circuits 66–69. In a fuse information reading mode for reading output signals φ70–φ73 of fuse circuits 70–73, selector 81 connects second input terminal DI to the input terminal of flip-flop 82.

Flip-flop 82 takes in a level of the output signal of selector 81 while shift clock signal SCLK is at an L level, and, in response to rising of shift clock signal SCLK from the L level to an H level, outputs a signal of the level taken in. Flip-flop 83 takes in a level of the output signal of flip-flop 82 while signal UPDR is at an L level, and, in response to rising of signal UPDR from the L level to an H level, outputs a signal of the level taken in. The output signals of flip-flops 82, 83 become signals φ66a, φ66b, respectively. The other register circuits 67–69 each have the same configuration as register circuit 66.

Figure 14:
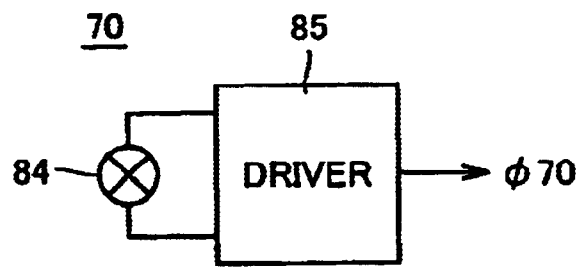
FIG. 14 is a circuit block diagram showing a configuration of the fuse circuit shown in FIG. 12.

Fuse circuit 70 includes a fuse 84 and a driver 85, as shown in FIG. 14. Fuse 84 is used for programming a defective row address signal detected in a wafer test, which is blown by a laser trimming device. Driver 85 drives signal φ70 to an L level when fuse 84 is not blown, and drives signal φ70 to an H level when fuse 84 is blown. The other fuse circuits 71–73 each have the same configuration as fuse circuit 70. Replacement-repair unit circuit 78 also has the same configuration as replacement-repair unit circuit 65.

Figure 15:
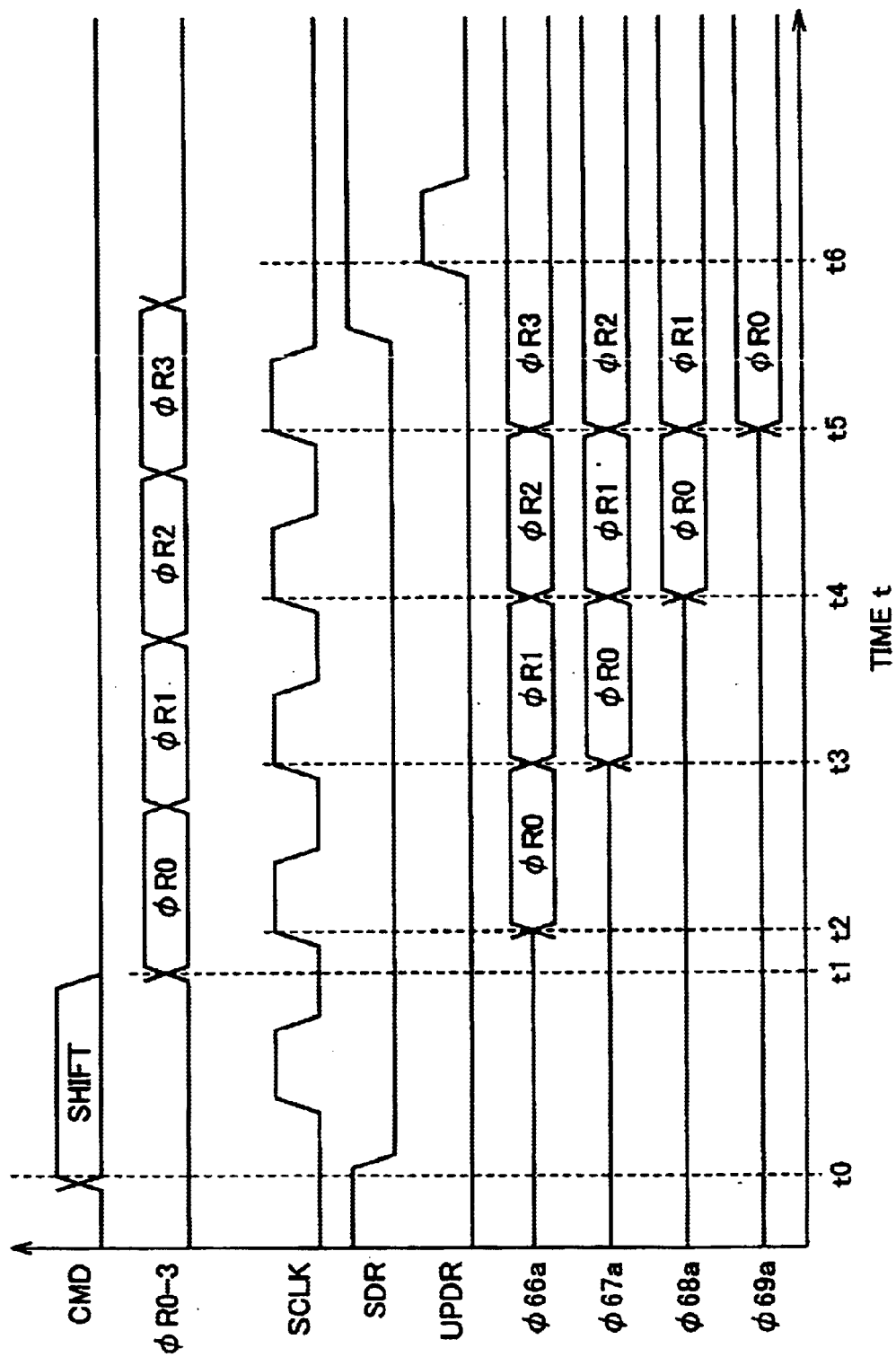
FIG. 15 is a time chart illustrating the operation of the replacement-repair circuit, shown in FIGS. 12–14, in a register information setting mode.

FIG. 15 is a time chart illustrating the operation of replacement-repair circuit 12, shown in FIGS. 12–14, in the register information setting mode. If a defective address is newly detected in a final test conducted after packaging, the semiconductor integrated circuit device is set to the register information setting mode. Here, a case will be described where a defective row address was detected, not in the wafer test, but in the final test.

Referring to FIG. 15, a shift command is input at a given time t0. In response, control signal SDR falls from an H level to an L level and, in each of register circuits 66–69, first input terminal TDI is connected to the input terminal of flip-flop 82 via selector 81. Shift clock signal SCLK is also generated for driving flip-flop 82 of each of register circuits 66–69.

Next, starting at time t1, signals φR0–φR3 are sequentially input, each by one clock cycle, from control circuit 64 to first input terminal TDI of register circuit 66. Flip-flop 82 of respective register circuit 66–69 takes in the level of the input signal while shift clock signal SCLK is at an L level, and, in response to rising of shift clock signal SCLK from the L level to an H level, outputs a signal of the level taken in. Thus, counting from time t1, in response to the fourth rising edge of shift clock signal SCLK (at time t5), output signals φ66a–φ69a of flip-flops 82 of register circuits 66–69 attain the same levels as signals φR3–φR0, respectively.

Next, in response to a falling edge of signal SCLK following the rising edge at time t5, control signal SDR rises from an L level to an H level. Thus, in each of register circuits 66–69, second input terminal DI is connected to the input terminal of flip-flop 82, and shift clock signal SCLK is fixed to an L level.

Next, at time t6, control signal UPDR is raised to an H level for a prescribed time period. Output signals φ66b–φ69b of flip-flops 83 of register circuits 66–69 attain the same levels as signals φR3–φR0, respectively. Since no defective row address was detected in the wafer test, output signals φ70–φ73 of fuse circuits 70–73 are all at an L level. Thus, output signals φRE, φRA2–φRA0 of OR gates 74–77 attain the same levels as signals φR3–φR0. Accordingly, the defective row address detected in the final test after packaging is set to replacement-repair circuit 12.

Figure 16:
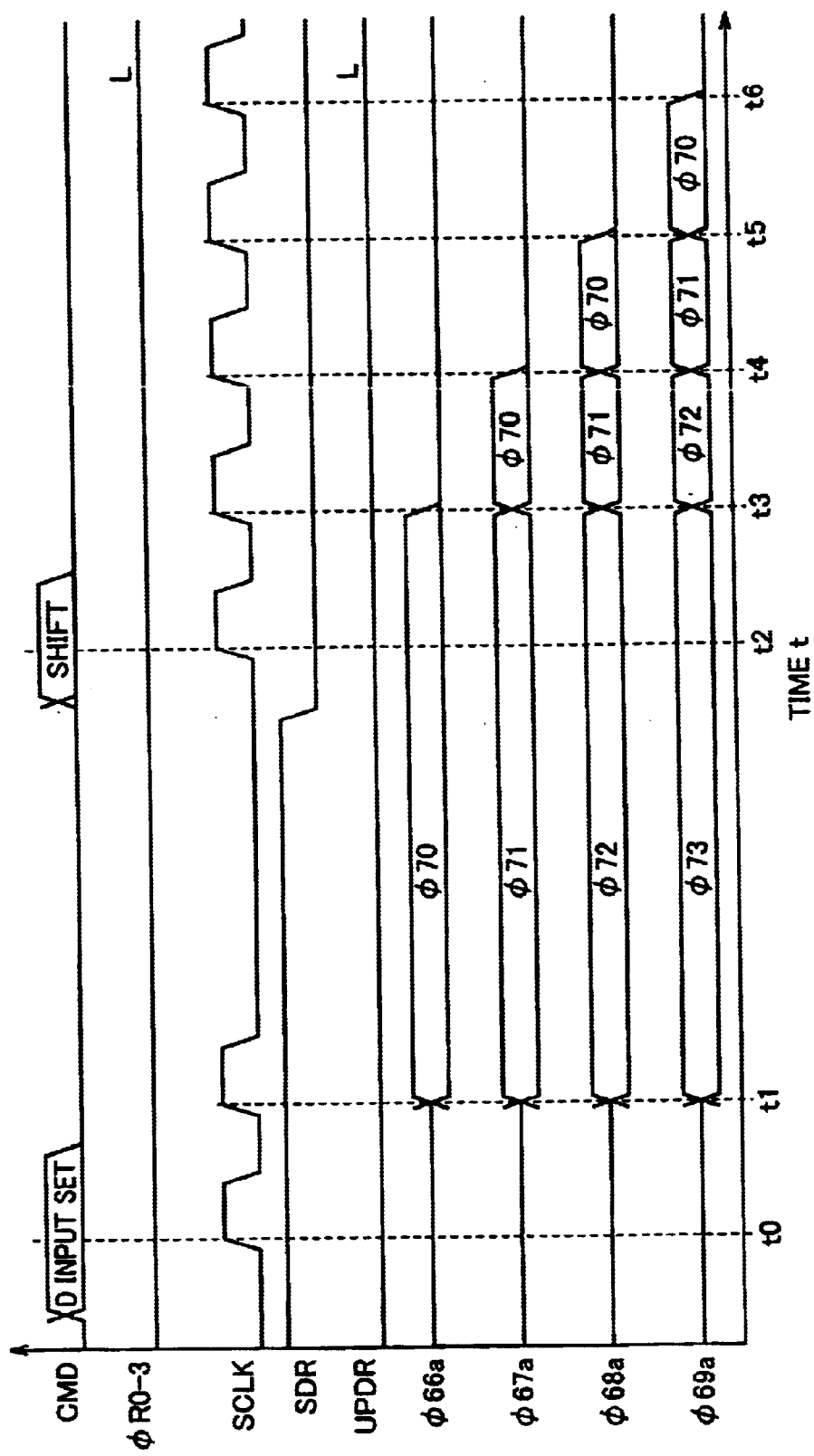
FIG. 16 is a time chart illustrating the operation of the replacement-repair circuit, shown in FIGS. 12–14, in a fuse information reading mode.

FIG. 16 is a time chart illustrating the operation of replacement-repair circuit 12, shown in FIGS. 12–14, in the fuse information reading mode. In the fuse information reading mode, signals φR0–φR3 and UPDR are all fixed to an L level. In an initial state, signal SDR is set to an H level, and second input terminal DI is connected to the input terminal of flip-flop 82 via selector 81. When a D input set command is input at a given time t0, shift clock signal SCLK is generated. When shift clock signal SCLK is raised from an L level to an H level at time t1, output signals φ66a–φ69a of flip-flops 82 of register circuits 66–69 attain the same levels as output signals φ70–φ73 of fuse circuits 70–73, respectively.

Next, at time t2, a shift command is input, and shift clock signal SCLK is generated again. Control signal SDR falls from an H level to an L level and, in each of register circuits 66–69, first input terminal TDI is connected to the input terminal of flip-flop 82 via selector 81. At every rising of shift clock signal SCLK from an L level to an H level, the levels of first input terminals TDI of register circuits 66–69 are transmitted to first output terminals TDO. Thus, register circuit 69 outputs output signals φ73–φ70 of fuse circuits 73–70 at times t2–t5, respectively. The output signal of register circuit 69 is externally output via register circuits 66–69 of replacement-repair unit circuit 78 and a prescribed signal terminal (not shown). By reading output signals φ70–φ73 of fuse circuits 70–73 in each of replacement-repair unit circuits 65 and 78, it is readily possible to determine whether spare word line SWL and spare bit line SBL are in use, and hence, whether repair is still possible after packaging.

Hereinafter, the operation of semiconductor integrated circuit device 1, shown in FIGS. 1–16, in the test mode will be described in brief. At power on of semiconductor integrated circuit device 1, each of memory chips 2–2 is provided with a power supply voltage and enters a standby state. When a test command is input to mode control circuit 6 by control signal CNT, memory circuit 5 is connected to pattern generation tester circuit 9 and repair analysis circuit 10 by selectors 7, 8.

Address signal ADD, control signal CNT and write data signal D are provided from pattern generation tester circuit 9 to memory circuit 5, and data signal D is written into each memory cell MC of memory circuit 5. Next, address signal ADD and control signal CNT are provided from pattern generation tester circuit 9 to memory circuit 5, and data signal Q is read out of each memory cell MC of memory circuit 5, and at the same time, address signal ADD and expected value ED are provided from pattern generation tester circuit 9 to repair analysis circuit 10. Repair analysis circuit 10 compares read data signal Q from memory cell MC with expected value ED, and based on the comparison result, obtains defective row address signals $\phi R0$–$\phi Rm$ and defective column address signals $\phi C0$–$\phi Cm$ to be replaced. Defective row address signals $\phi R0$–$\phi Rm$ and defective column address signals $\phi C0$–$\phi Cm$ are written into replacement storage circuit 11.

The defective address signal read out of replacement storage circuit 11 is held in replacement-repair circuit 12 and applied to memory circuit 5. Thus, the defective memory cell MC in memory circuit 5 is replaced with spare memory cell SMC. The testing and repairing operations as described above are performed in memory chips 2–2 simultaneously in parallel with each other.

Figure 17:
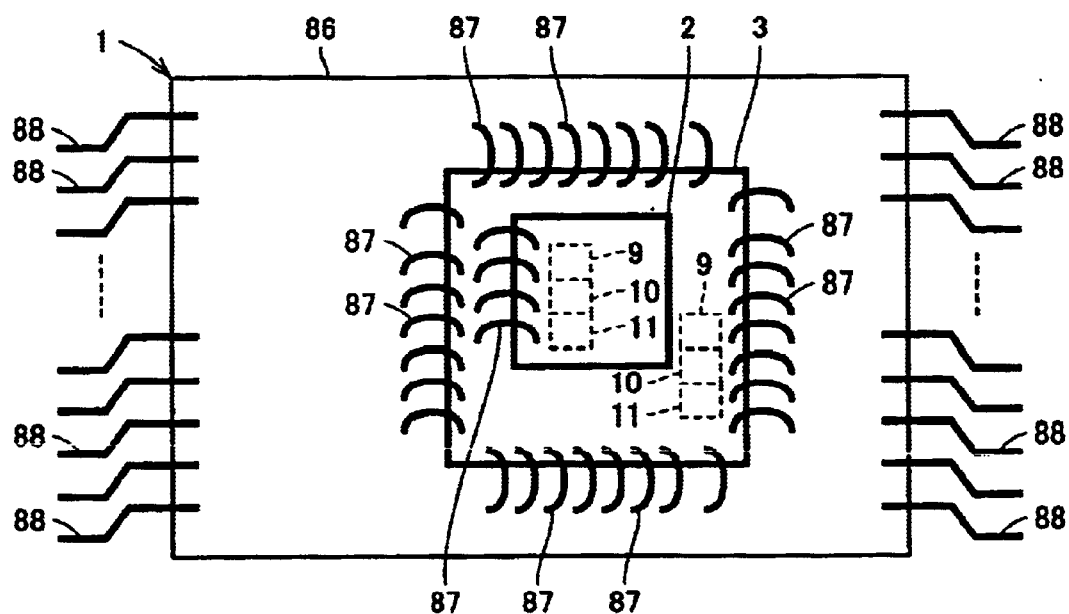
FIG. 17 illustrates assembly arrangement of the semiconductor integrated circuit device shown in FIGS. 1–16.

FIG. 17 shows assembly arrangement of semiconductor integrated circuit device 1. Referring to FIG. 17, memory chip 3 is mounted on the front face of a rectangular, lead frame 86. Memory chip 2 is mounted on the surface of memory chip 3. Memory chip 4 is mounted on the rear face of lead frame 86. Each memory chip 2–2 is provided with pattern generation tester circuit 9, repair analysis circuit 10, and replacement storage circuit 11, as described above. Memory chips 2 and 3 are connected to each other via a plurality of bonding wire 87. Memory chip 3 and lead frame 86 are connected to each other via a plurality of bonding wire 87. A plurality of leads 88 are provided on the periphery of lead frame 86. A plurality of interconnections (not shown) are formed on lead frame 86. Each lead 88 is connected to memory chip 3 via the interconnections and bonding wire 87. Thereafter, all the portions except for the ends of leads 88 are sealed with resin or the like, so that packaging of semiconductor integrated circuit device 1 is completed.

In the first embodiment, a defective address signal in a memory chip is obtained by pattern generation tester circuit 9 and repair analysis circuit 10, and written into replacement storage circuit 11. The defective address signal read out of replacement storage circuit 11 is transferred to replacement-repair circuit 12, and memory cell MC corresponding to the defective address signal is replaced with spare memory cell SMC. Thus, even if defective memory cell MC takes place after packaging, it can be replaced with spare memory cell SMC, thereby improving the yield of semiconductor integrated circuit device 1.

Further, a plurality of memory chips 2–2 are tested simultaneously, in parallel with each other, by a plurality of sets of pattern generation tester circuits 9 and repair analysis circuits 10. Thus, compared to the case where memory chips 2–2 are being tested in series, the time required for the testing is reduced.

In addition, the output signals $\phi 70$–$\phi 73$ of fuse circuits 70–73 can be externally read out. Thus, it is readily possible to determine whether spare word line(s) WL and spare bit line(s) BL are still available after packaging. The changes in the states of defectiveness before and after the packaging can also be examined with ease, allowing simple analysis for improvement of the yield.

Second Embodiment

Figure 18:
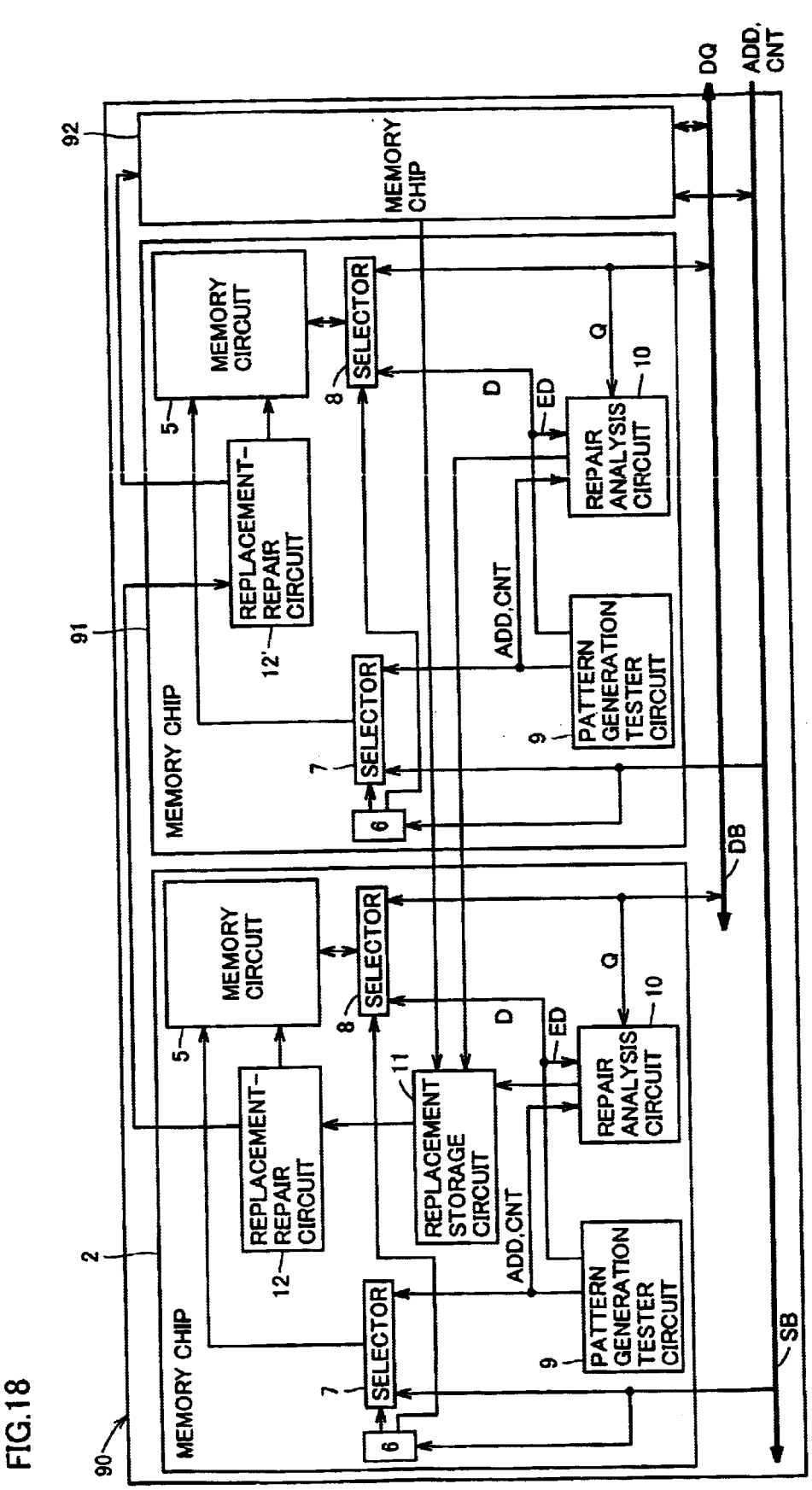
FIG. 18 is a block diagram showing a configuration of the semiconductor integrated circuit device according to a second embodiment of the present invention.

Referring to FIG. 18, the semiconductor integrated circuit device 90 according to the second embodiment of the present invention is provided with memory chips 2, 91 and 92. Memory chips 91 and 92 differ from memory chips 3 and 4 in FIG. 1 in that replacement storage circuit 11 is removed, and replacement-repair circuit 12 is replaced with a replacement-repair circuit 12'. Replacement-repair circuit 12' is identical to replacement-repair circuit 12 shown in FIG. 12 except that control circuit 64 is removed. Signals SCLK, SDR, UPDR are provided from control circuit 64 of replacement-repair circuit 12 in memory chip 2 to replacement-repair circuits 12' in memory chips 91 and 92. First output terminal TDO of register circuit 69 at the last stage of replacement-repair circuit 12 in memory chip 2 is connected to first input terminal TDI of register circuit 66 at the first stage of replacement-repair circuit 12' in memory chip 92. First output terminal TDO of register circuit 69 at the last stage of replacement-repair circuit 12' in memory chip 91 is connected to first input terminal TDI of register circuit 66 at the first stage of replacement-repair circuit 12' in memory chip 92.

The defective row and column address signals obtained at repair analysis circuits 10 in memory chips 91, 92 are stored in replacement storage circuit 11 in memory chip 2. The defective row and column address signals read out of replacement storage circuit 11 are set to replacement-repair circuit 12 in memory chip 2, and also set to replacement-repair circuits 12' in memory chips 91, 92 via replacement-repair circuit 12 in memory chip 2. Otherwise, the configuration and operation of semiconductor integrated circuit device 90 of the second embodiment are identical to those of semiconductor integrated circuit device 1 shown in FIG. 1, and thus, description thereof is not repeated.

Figure 19:
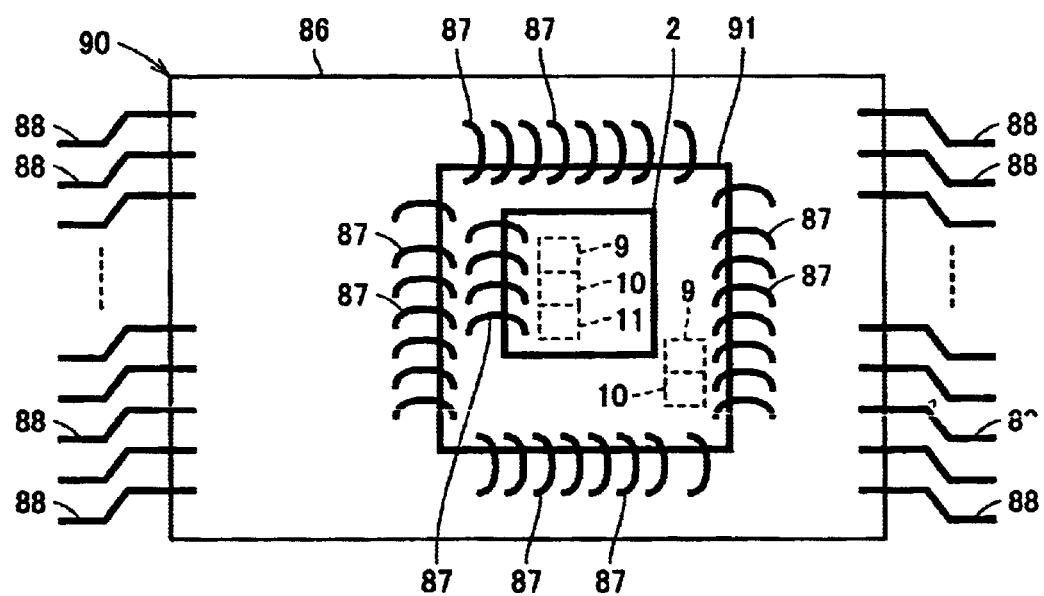
FIG. 19 illustrates assembly arrangement of the semiconductor integrated circuit device shown in FIG. 18.

FIG. 19 shows assembly arrangement of semiconductor integrated circuit device 90. Referring to FIG. 19, memory chip 91 is mounted on the front face of a rectangular, lead frame 86. Memory chip 2 is mounted on the surface of memory chip 91. Memory chip 92 is mounted on the rear face of lead frame 86. Memory chip 2 is provided with pattern generation tester circuit 9, repair analysis circuit 10 and replacement storage circuit 11. Memory chips 91 and 92 are each provided with pattern generation tester circuit 9 and repair analysis circuit 10. Memory chips 2 and 9 are connected to each other via a plurality of bonding wire 87. Memory chip 91 and lead frame 86 are connected via a plurality of bonding wire 87. A plurality of leads 88 are provided on the periphery of lead frame 86. Each lead 88 is connected to memory chip 91 via interconnections (not shown) of lead frame 86 and bonding wire 87. Thereafter, the entire structure, except the ends of leads 88, is sealed with resin or the like, and thus, packaging of semiconductor integrated circuit device 90 is completed.

In the second embodiment, replacement storage circuit 11 is provided only to memory chip 2. This allows reduction in chip area of the other memory chips 91 and 92. If replacement storage circuit 11 is formed of a flash memory, the replacement storage circuit 11 and memory circuit 5 in memory chip 2 can be manufactured in the same process. This leads to simplification of the manufacturing process.

Third Embodiment

Figure 20:
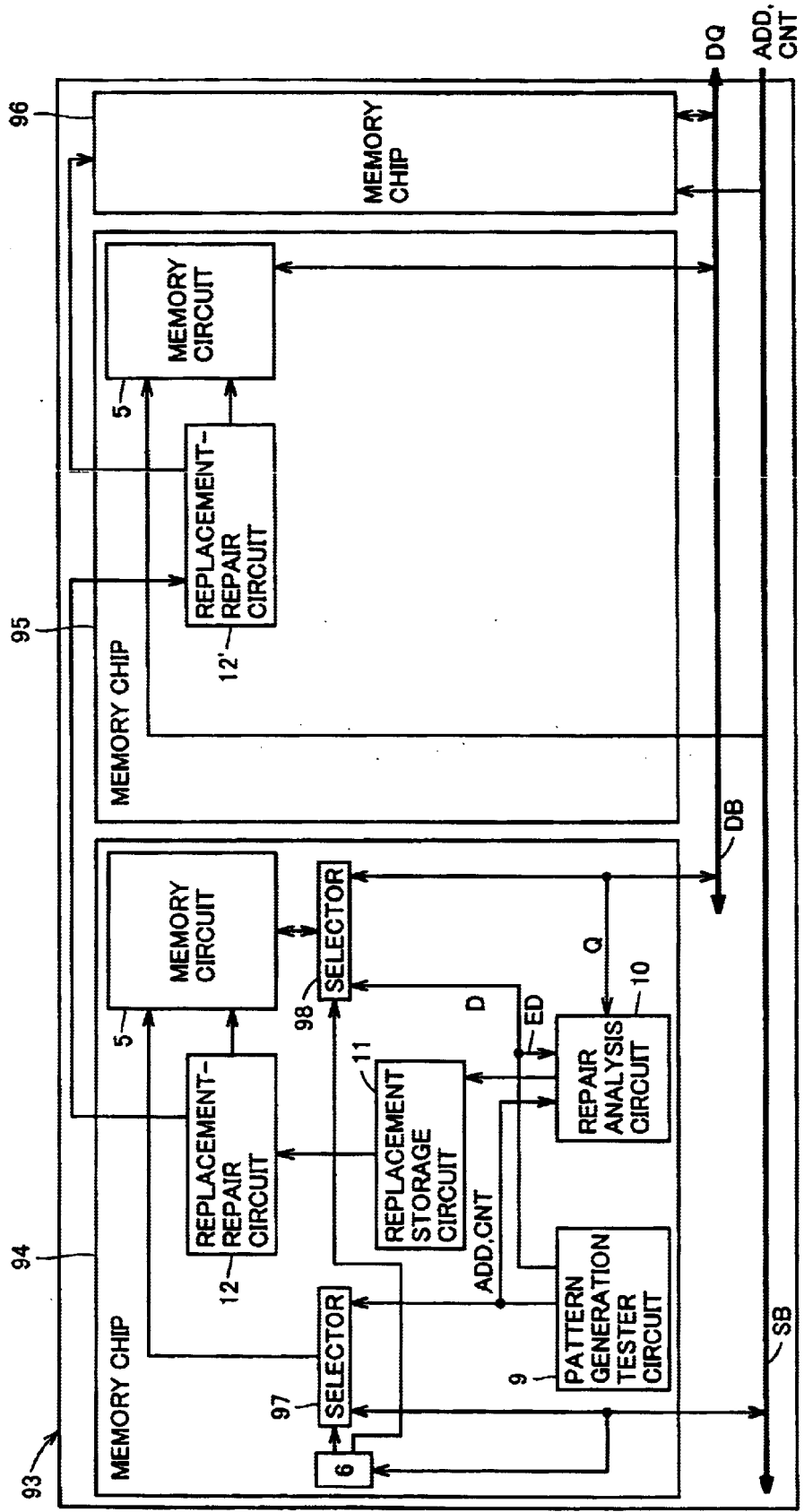
FIG. 20 is a block diagram showing a configuration of the semiconductor integrated circuit device according to a third embodiment of the present invention.

Referring to FIG. 20, the semiconductor integrated circuit device 93 according to the third embodiment of the present invention includes memory chips 94–96. Memory chip 94 is identical to memory chip 2 in FIG. 18 except that selectors 7, 8 are replaced with selectors 97, 98, respectively. Memory chips 95, 96 correspond to memory chips 91, 92 in FIG. 18 from each of which mode control circuit 6, selectors 7, 8, pattern generation tester circuit 9 and repair analysis circuit 10 are removed.

Selector 97 is controlled by mode control circuit 6. In the normal operation, selector 97 applies the address signal ADD and control signal CNT that were externally supplied via signal bus SB, to memory circuit 5 in memory chip 94. In the test mode, selector 97 applies the address signal ADD and control signal CNT that were generated by pattern generation tester circuit 9, to memory circuit 5 in memory chip 94 and also to memory circuits 5 in memory chips 95, 96 via signal bus SB.

Selector 98 is controlled by mode control circuit 6. In the normal operation, selector 98 connects data bus DB with memory circuit 5. In the writing operation of the test mode, selector 98 applies the write date signal D that was generated by pattern generation tester circuit 9, to memory circuit 5 in memory chip 94 and also to memory circuits 5 in memory chips 95, 96 via data bus DB. In the reading operation of the test mode, selector 98 applies the read data signal Q from memory circuit 5 in memory chip 94 to repair analysis circuit 10.

The operation of semiconductor integrated circuit device 93 in the test mode will now be described. When a test command is input to mode control circuit 6 by external control signal CNT, selectors 97, 98 connect pattern generation tester circuit 9 to memory circuits 5 in respective memory chips 94–96.

Control signal CNT, address signal ADD and write data signal D are applied from pattern generation tester circuit 9 to memory circuits 5 in memory chips 94–96, so that the data signal D is written into each memory cell MC of memory circuits 5 in memory chips 94–96. Control signal CNT and address signal ADD are then applied from pattern generation tester circuit 9 to each memory circuit 5, so that data signal Q is read out of each memory cell MC of each memory circuit 5. At the same time, address signal ADD and expected value ED are applied from pattern generation tester circuit 9 to repair analysis circuit 10.

Repair analysis circuit 10 compares read data signal Q from memory cell MC with expected value ED and, based on the comparison result, obtains defective row address signals φR0–φRm and defective column address signals φC0–φCm to be replaced, which are written into replacement storage circuit 11. The defective row and column address signals read out of replacement storage circuit 11 are sequentially set to replacement-repair circuit 12 in memory chip 2 and to replacement-repair circuits 12' in memory chips 95, 96.

Figure 21:
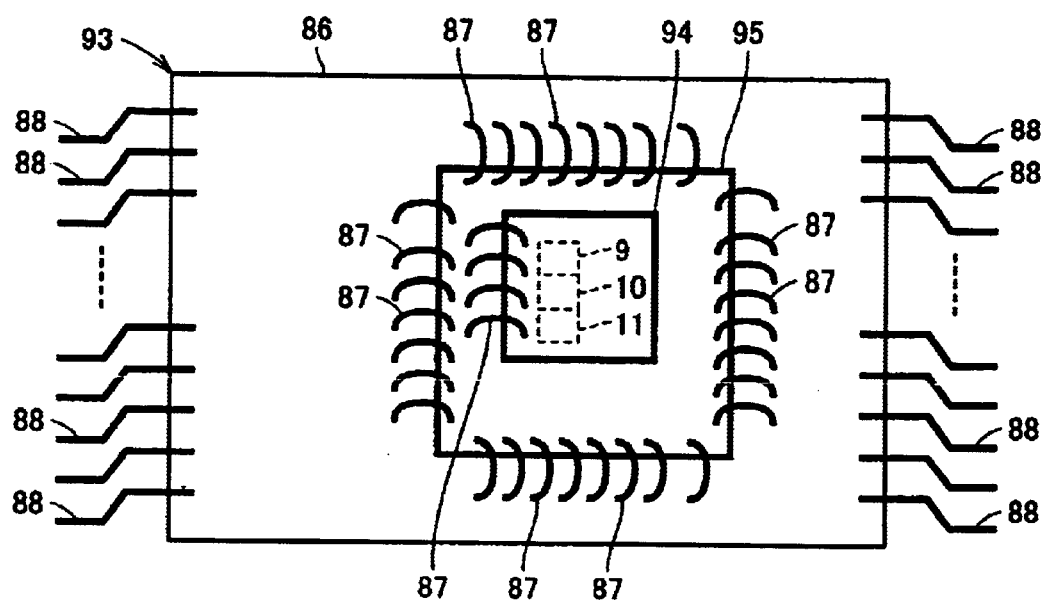
FIG. 21 illustrates assembly arrangement of the semiconductor integrated circuit device shown in FIG. 20.

FIG. 21 shows assembly arrangement of semiconductor integrated circuit device 93. Referring to FIG. 21, memory chip 95 is mounted on the front face of a rectangular, lead frame 86. Memory chip 94 is mounted on the surface of memory chip 95. Memory chip 96 is mounted on the rear face of lead frame 86. Of memory chips 94–96, only memory chip 94 is provided with pattern generation tester circuit 9, repair analysis circuit 10, and replacement storage circuit 11. Memory chip 94 is connected to memory chip 95 via a plurality of bonding wire 87. Memory chip 95 is connected to a plurality of leads 88 on the periphery of lead frame 86 via a plurality of bonding wire 87. The entire structure is then sealed with resin or the like, leaving the ends of leads 88, so that packaging of semiconductor integrated circuit device 93 is completed.

In the third embodiment, pattern generation tester circuit 9, repair analysis circuit 10 and replacement storage circuit 11 are provided solely to memory chip 94. This enables reduction in chip area as well as simplification in design and control of the other memory chips 95, 96.

Although pattern generation tester circuit 9, repair analysis circuit 10 and replacement storage circuit 11 have been provided to memory chip 94 in the description above, the embodiment is not limited thereto. Those circuits may be provided to any of the memory chips 94–96 having a large free space.

Fourth Embodiment

Figure 22:
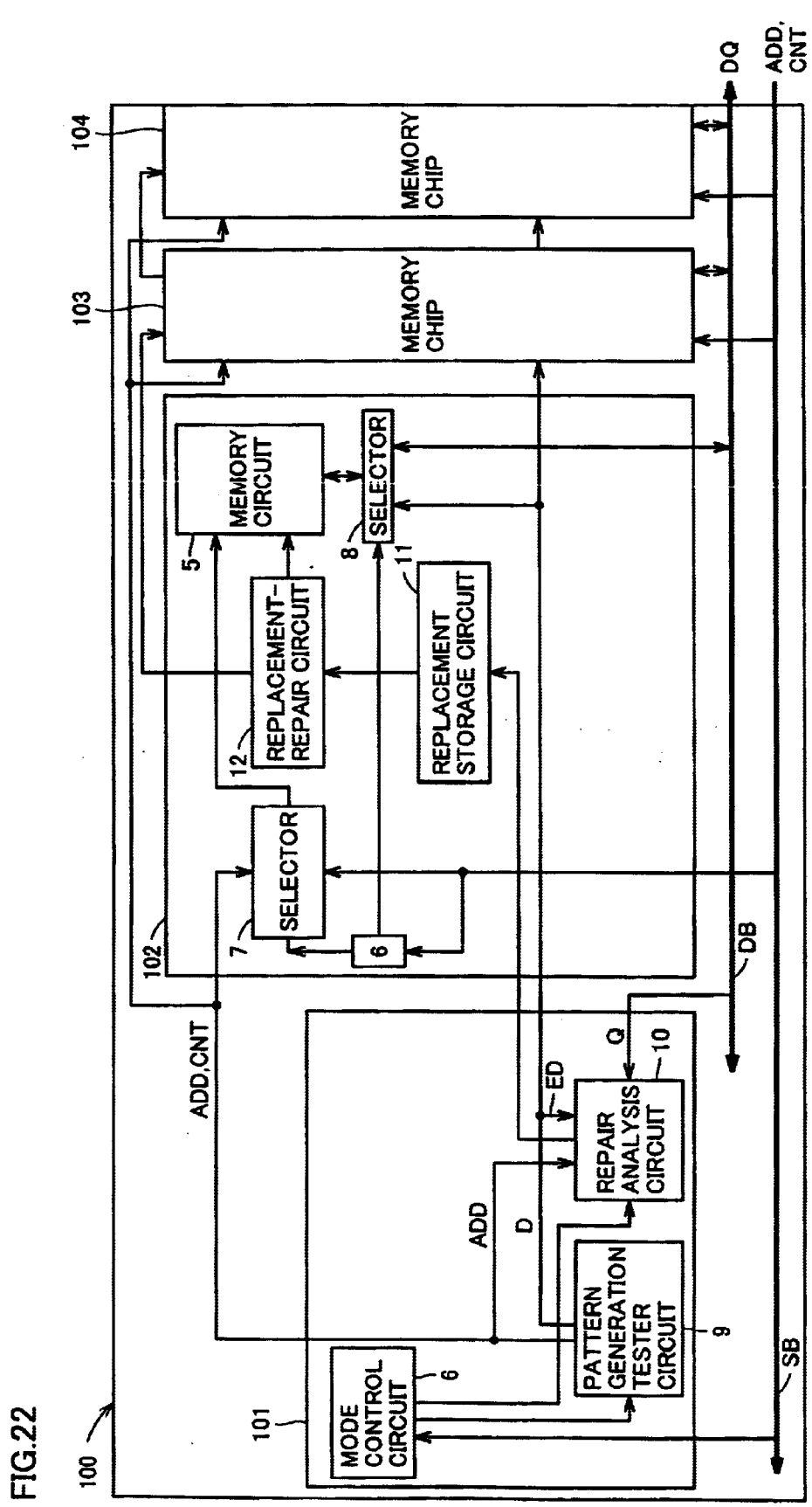
FIG. 22 is a block diagram showing a configuration of the semiconductor integrated circuit device according to a fourth embodiment of the present invention.

Referring to FIG. 22, the semiconductor integrated circuit device 100 according to the fourth embodiment of the present invention is provided with a test chip 101 and memory chips 102–104. Memory chip 102 is identical to memory chip 2 in FIG. 18 except that pattern generation tester circuit 9 and repair analysis circuit 10 are removed. Memory chips 103, 104 correspond to memory chips 91, 92 in FIG. 18 from each of which pattern generation tester circuit 9 and repair analysis circuit 10 are removed.

Test chip 101 includes mode control circuit 6, pattern generation tester circuit 9 and repair analysis circuit 10. Mode control circuit 6 controls pattern generation tester circuit 9 and repair analysis circuit 10 in accordance with control signal CNT externally supplied via signal bus SB. In the writing operation of the test mode, pattern generation tester circuit 9 generates control signal CNT, address signal ADD and write data signal D, and provides control signal CNT and address signal ADD to selectors 7 in memory chips 102–104, and provides write data signal D to selectors 8 in memory chips 102–104. In the reading operation of the test mode, pattern generation tester circuit 9 generates control signal CNT, address signal ADD and expected value ED, and provides control signal CNT and address signal ADD to selectors 7 in memory chips 102–104, and provides address signal ADD and expected value ED to repair analysis circuit 10.

Repair analysis circuit 10, in the reading operation of the test mode, compares read data signal Q provided from memory circuits 5 in memory chips 102–104 via data bus DB with expected value ED provided from pattern generation tester circuit 9 and, based on the comparison result, generates defective address signals to be replaced in memory chips 102–104. The defective address signals are written into replacement storage circuit 11 in memory chip 102. The defective address signals read out of replacement storage circuit 11 are sequentially set to replacement-repair circuit 12 in memory chip 102 and also to replacement-repair circuits 12' in respective memory chips 103, 104.

Figure 23:
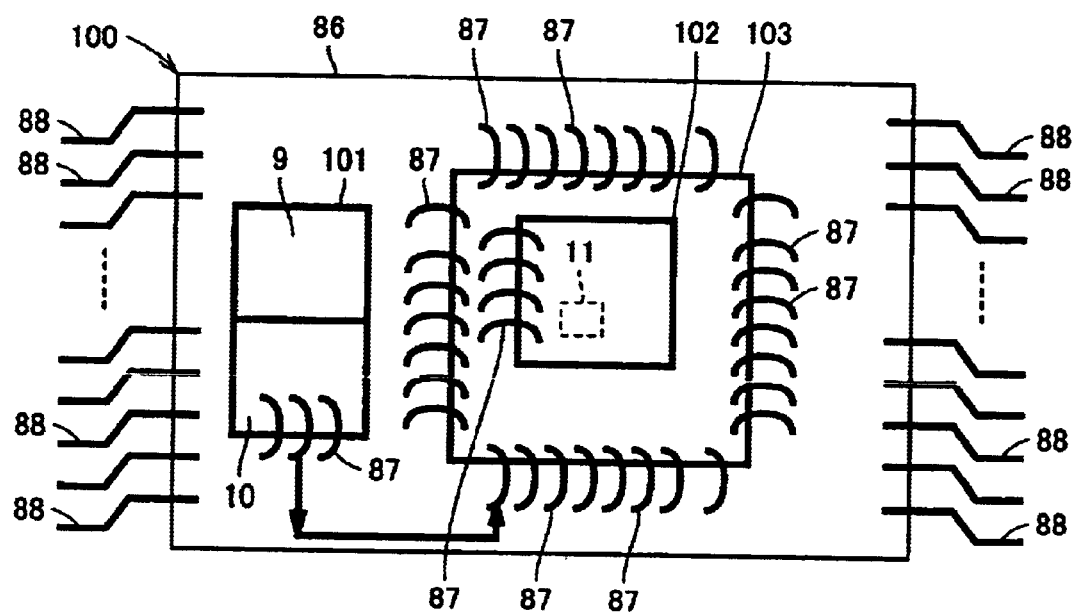
FIG. 23 illustrates assembly arrangement of the semiconductor integrated circuit device shown in FIG. 22.

FIG. 23 shows assembly arrangement of semiconductor integrated circuit device 100. Referring to FIG. 23, test chip 101 and memory chip 103 are mounted, adjacent to each other, on the front face of a rectangular, lead frame 86. Memory chip 102 is mounted on the surface of memory chip 103. Memory chip 104 is mounted on the rear face of lead frame 86. Test chip 101 is provided with pattern generation tester circuit 9 and repair analysis circuit 10. Memory chip 102 is provided with replacement storage circuit 11. Chips 101–104 are connected with each other via a plurality of bonding wire 87 and interconnections of lead frame 86. Chips 101–104 and a plurality of leads 88 on the periphery of lead frame 86 are coupled with each other via a plurality of bonding wire 87 and the interconnections of lead frame 86. Thereafter, all the portions except for the ends of leads 88 are sealed with resin or the like, and thus, packaging of semiconductor integrated circuit device 100 is completed.

In the fourth embodiment, pattern generation tester circuit 9 and repair analysis circuit 10 are provided to test chip 101. Thus, internal circuits of memory chips 102–104 can be simplified and downsized.

Further, test chip 101 can be manufactured with an optimal process rule independent of memory chips 102–104. Accordingly, degradation in yield of the memory chips due to defectiveness of pattern generation tester circuit 9 or repair analysis circuit 10 is prevented, allowing reduction of the device costs.

Fifth Embodiment

Figure 24:
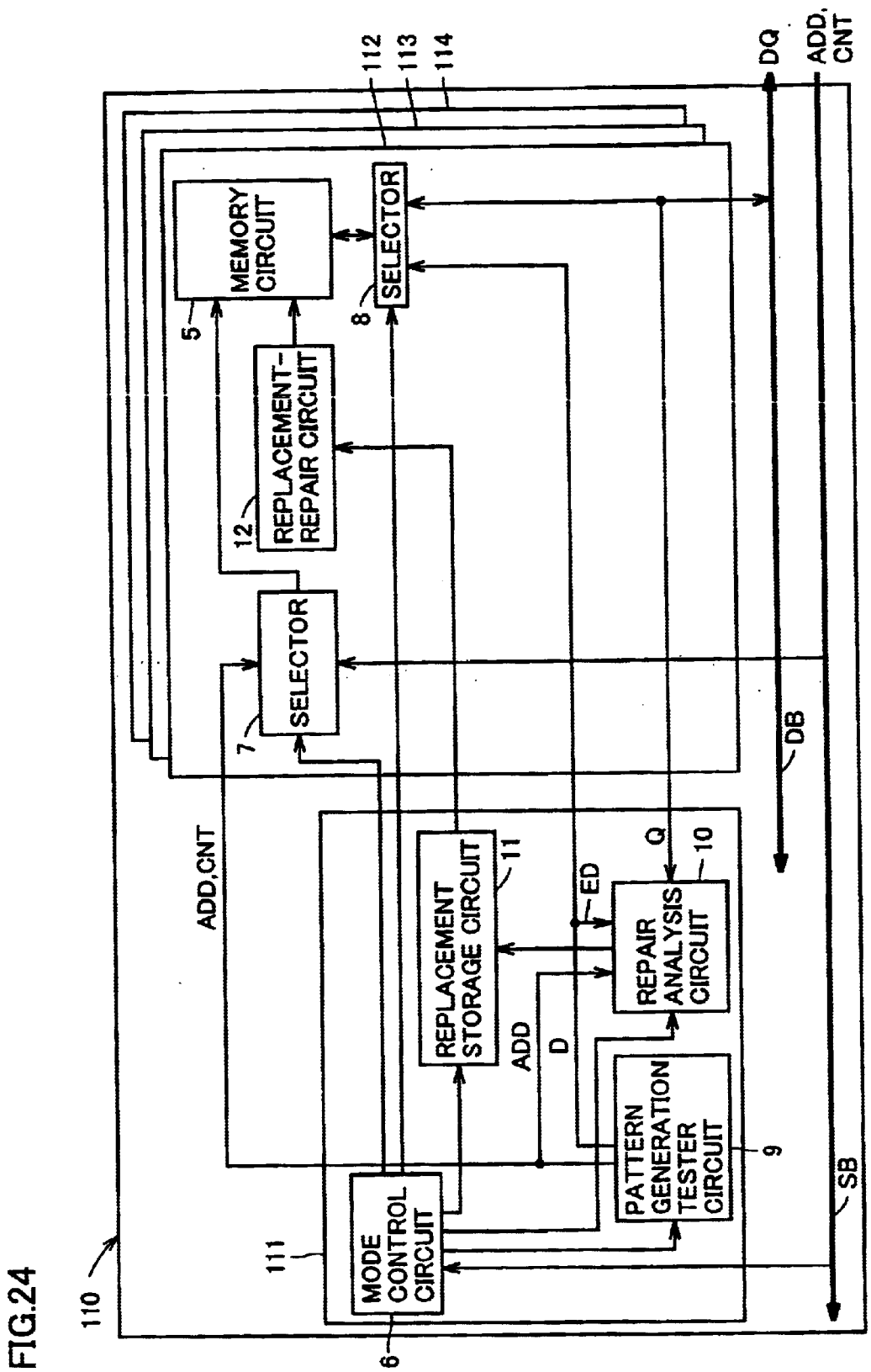
FIG. 24 is a block diagram showing a configuration of the semiconductor integrated circuit device according to a fifth embodiment of the present invention.

Referring to FIG. 24, the semiconductor integrated circuit device 110 according to the fifth embodiment of the present invention is provided with a test chip 111 and memory chips 112–114. Test chip 111 is identical to test chip 101 in FIG. 22 except that replacement storage circuit 11 is added. Memory chip 112 corresponds to memory chip 102 in FIG. 22 from which replacement storage circuit 11 and mode control circuit 6 are removed. Memory chips 113, 114 are each identical to memory chip 112 and include memory circuit 5, selectors 7, 8 and replacement-repair circuit 12. It is noted that memory circuits 5 in memory chips 112–114 are formed of flash memory, DRAM and SRAM, respectively.

In semiconductor integrated circuit device 110, memory chips 112–114 are tested and repaired in parallel at the same time. More specifically, when a test command is input to mode control circuit 6 in test chip 111 by external control signal CNT, pattern generation tester circuit 9 in test chip 111 is coupled to each memory circuit 5 in respective memory chip 112-114.

Control signal CNT, address signal ADD and write data signal D are provided from pattern generation tester circuit 9 to memory circuits 5 in respective memory chips 112–114, and data signal D is written into each memory cell MC of memory circuits 5 in memory chips 112–114. Control signal CNT and address signal ADD are then provided from pattern generation tester circuit 9 to respective memory circuits 5, and data signal Q is read out of each memory cell MC of respective memory circuits 5. Address signal ADD and expected value ED are also provided from pattern generation tester circuit 9 to repair analysis circuit 10.

Repair analysis circuit 10 compares read data signal Q from memory cell MC with expected value ED and, based on the comparison result, obtains defective address signals to be replaced. The defective address signals are written into replacement storage circuit 11. The defective address signals read out of replacement storage circuit 11 are set to replacement-repair circuits 12 in respective memory chips 112–114 in parallel at the same time.

Figure 25:
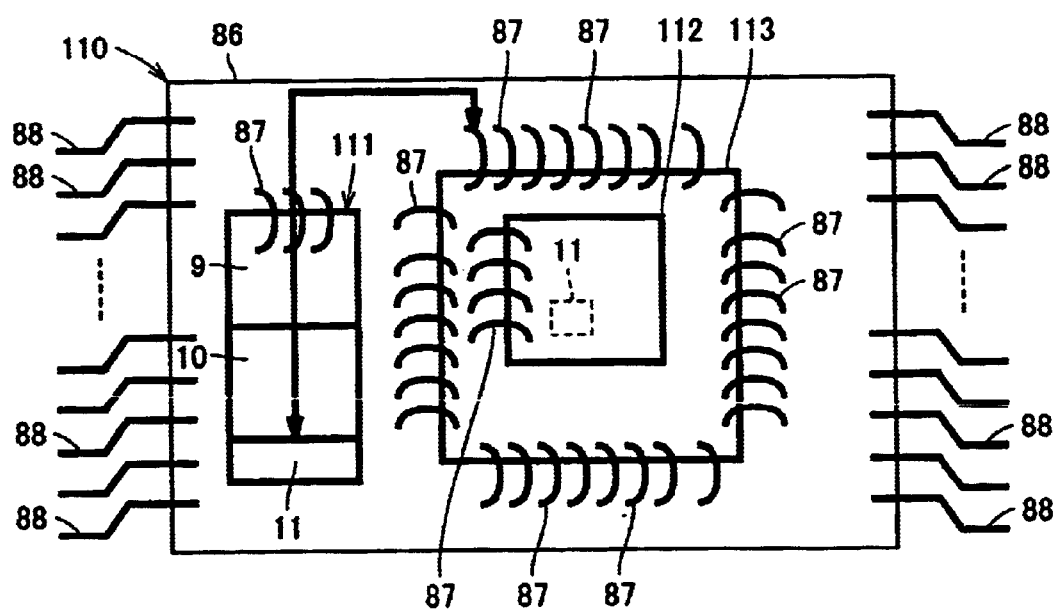
FIG. 25 illustrates assembly arrangement of the semiconductor integrated circuit device shown in FIG. 24.

FIG. 25 shows assembly arrangement of semiconductor integrated circuit device 110. Referring to FIG. 25, test chip 111 and memory chip 113 are mounted, adjacent to each other, on the front face of a rectangular, lead frame 86. Memory chip 112 is mounted on the surface of memory chip 113. Memory chip 114 is mounted on the rear face of lead frame 86. Test chip 111 is provided with pattern generation tester circuit 9, repair analysis circuit 10 and replacement storage circuit 11. Chips 111–114 are coupled with each other via a plurality of bonding wire 87 and interconnections of lead frame 86. Chips 111–114 and a plurality of leads 88 on the periphery of lead frame 86 are coupled via a plurality of bonding wire 87 and the interconnections of lead frame 86. Thereafter, leaving the ends of leads 88, the entire structure is sealed with resin or the like, so that packaging of semiconductor integrated circuit device 110 is completed.

The fifth embodiment can realize the same effects as in the fourth embodiment. In addition, since the defective address signals read out of replacement storage circuit 11 can be set in parallel to replacement-repair circuits 12 in respective memory chips 112–114, the time required from the power on to the completion of setting of the defective address signals is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a plurality of memory chips, each including a plurality of memory cells preassigned respectively with specific address signals, a spare memory cell for replacement of defective one of said plurality of memory cells, a holding circuit for holding the address signal of said defective memory cell, a memory cell select circuit receiving an address signal and selecting said spare memory cell for replacement of the memory cell corresponding to the received address signal when the received address signal matches the address signal held in said holding circuit, and selecting the memory cell corresponding to the received address signal when the received address signal differs from the address signal held in said holding circuit, and a write/read circuit performing writing/reading of a data signal to/from the memory cell selected by said memory cell select circuit;
    a tester circuit testing said plurality of memory chips in parallel, and obtaining the address signal of the defective one of said plurality of memory cells in each memory chip;
    a nonvolatile memory storing the address signal obtained by said tester circuit; and
    a transfer control circuit reading the address signal out of said nonvolatile memory for transfer to the holding circuit in the memory chip corresponding to the address signal.

2. The semiconductor device according to claim 1, wherein
    said tester circuit includes a plurality of sub-tester circuits provided corresponding to said plurality of memory chips,
        each sub-tester circuit being provided to the corresponding memory chip for testing thereof, and obtaining the address signal of the defective one of the plurality of memory cells in the corresponding memory chip,
    said nonvolatile memory includes a plurality of sub-nonvolatile memories provided corresponding to said plurality of memory chips,
        each sub-nonvolatile memory being provided to the corresponding memory chip and storing the address signal obtained by the corresponding sub-tester circuit, and
    the address signal read out of the each sub-nonvolatile memory is transferred to the corresponding holding circuit.

3. The semiconductor device according to claim 1, wherein
    said tester circuit includes a plurality of sub-tester circuits provided corresponding to said plurality of memory chips,
        each sub-tester circuit being provided to the corresponding memory chip for testing thereof, and obtaining the address signal of the defective one of the plurality of memory cells in the corresponding memory chip,
    said nonvolatile memory is provided to predetermined one of said plurality of memory chips and stores the address signal obtained by the each sub-tester circuit, the holding circuits of said plurality of memory chips are connected in series, and the address signal read out of said nonvolatile memory is transferred via one of the holding circuits to another one of the holding circuits.

4. The semiconductor device according to claim 3, wherein said predetermined memory chip is a flash memory, and said nonvolatile memory is a flash memory.

5. The semiconductor device according to claim 1, wherein said tester circuit and said nonvolatile memory are provided to predetermined one of said plurality of memory chips, the holding circuits of said plurality of memory chips are connected in series, and the address signal read out of said nonvolatile memory is transferred via one of the holding circuits to another one of the holding circuits.

6. The semiconductor device according to claim 5, wherein said predetermined memory chip is a flash memory, and said nonvolatile memory is a flash memory.

7. The semiconductor device according to claim 1, further comprising a test chip separately from said plurality of memory chips, wherein said tester circuit is provided to said test chip, said nonvolatile memory is provided to predetermined one of said plurality of memory chips, the holding circuits of said plurality of memory chips are connected in series, and the address signal read out of said nonvolatile memory is transferred via one of the holding circuits to another one of the holding circuits.

8. The semiconductor device according to claim 7, wherein said predetermined memory chip is a flash memory, and said nonvolatile memory is a flash memory.

9. The semiconductor device according to claim 1, further comprising a test chip separately from said plurality of memory chips, wherein said tester circuit and said nonvolatile memory are provided to said test chip, the holding circuits of said plurality of memory chips are connected in parallel with said nonvolatile memory, and the address signal read out of said nonvolatile memory is directly transferred to the corresponding holding circuit.

10. The semiconductor device according to claim 1, wherein said each memory chip further includes a program circuit having at least one fuse and programming the address signal of said defective memory cell based on whether said fuse is blown or not, said memory cell select circuit selecting the corresponding spare memory cell for replacement of the memory cell corresponding to the received address signal when the received address signal matches either one of the address signal programmed in the corresponding program circuit and the address signal held in the corresponding holding circuit, and selecting the memory cell corresponding to the received address signal when the received address signal is different from both the address signal programmed in the corresponding program circuit and the address signal held in the corresponding holding circuit.

11. The semiconductor device according to claim 10, further comprising a read circuit reading the address signal programmed in said program circuit for output externally.

* * * * *